(12) United States Patent
Chen et al.

(10) Patent No.: US 11,756,931 B2
(45) Date of Patent: Sep. 12, 2023

(54) CHIP PACKAGE STRUCTURE WITH MOLDING LAYER

(71) Applicant: TAIWAN SEMICONDUCTOR MANUFACTURING CO., LTD., Hsinchu (TW)

(72) Inventors: Wei-Yu Chen, New Taipei (TW); Li-Hsien Huang, Zhubei (TW); An-Jhih Su, Taoyuan (TW); Hsien-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 144 days.

(21) Appl. No.: 16/983,315

(22) Filed: Aug. 3, 2020

(65) Prior Publication Data
US 2020/0365563 A1   Nov. 19, 2020

Related U.S. Application Data

(62) Division of application No. 15/801,846, filed on Nov. 2, 2017, now Pat. No. 10,734,357, which is a division
(Continued)

(51) Int. Cl.
*H01L 25/065* (2023.01)
*H01L 25/00* (2006.01)
(Continued)

(52) U.S. Cl.
CPC ........ *H01L 25/0657* (2013.01); *H01L 21/486* (2013.01); *H01L 21/4857* (2013.01);
(Continued)

(58) Field of Classification Search
CPC ............ H01L 25/0657; H01L 21/4857; H01L 21/486; H01L 21/565; H01L 21/568;
(Continued)

(56) References Cited

U.S. PATENT DOCUMENTS 7,550,857 B1 *   6/2009   Longo ................. H01L 24/19
257/784
8,361,842 B2   1/2013   Yu et al.
(Continued)

FOREIGN PATENT DOCUMENTS

CN   102931102 A   2/2013
CN   103633075 A   3/2014

OTHER PUBLICATIONS

U.S. Office Action for U.S. Application No. 16/801,395, dated Jul. 14, 2021.

*Primary Examiner* — Bitew A Dinke
(74) *Attorney, Agent, or Firm* — Birch, Stewart, Kolasch & Birch, LLP

(57) ABSTRACT

A chip package structure is provided. The chip package structure includes a first chip, a second chip, and a third chip. The chip package structure includes a first molding layer surrounding the first chip and the second chip. The first molding layer is a single layer structure. A first boundary surface between the passivation layer and the second molding layer extends toward the first chip. The chip package structure includes a second molding layer surrounding the third chip and the first molding layer. A first bottom surface of the first molding layer and a second bottom surface of the second molding layer are substantially coplanar.

20 Claims, 20 Drawing Sheets

Related U.S. Application Data of application No. 15/208,764, filed on Jul. 13, 2016, now Pat. No. 9,825,007.

(51) Int. Cl.
*H01L 21/56* (2006.01)
*H01L 23/00* (2006.01)
*H01L 23/31* (2006.01)
*H01L 23/498* (2006.01)
*H01L 25/03* (2006.01)
*H01L 23/538* (2006.01)
*H01L 21/48* (2006.01)

(52) U.S. Cl.
CPC .......... *H01L 21/565* (2013.01); *H01L 21/568* (2013.01); *H01L 23/3135* (2013.01); *H01L 23/49811* (2013.01); *H01L 23/5389* (2013.01); *H01L 24/19* (2013.01); *H01L 24/20* (2013.01); *H01L 24/97* (2013.01); *H01L 25/03* (2013.01); *H01L 25/50* (2013.01); *H01L 21/561* (2013.01); *H01L 2224/04105* (2013.01); *H01L 2224/12105* (2013.01); *H01L 2224/24145* (2013.01); *H01L 2224/24227* (2013.01); *H01L 2224/32145* (2013.01); *H01L 2224/32225* (2013.01); *H01L 2224/73267* (2013.01); *H01L 2224/83005* (2013.01); *H01L 2224/97* (2013.01); *H01L 2225/06548* (2013.01); *H01L 2225/06568* (2013.01); *H01L 2225/06582* (2013.01); *H01L 2225/06596* (2013.01); *H01L 2924/18162* (2013.01); *H01L 2924/3511* (2013.01)

(58) Field of Classification Search
CPC ........... H01L 23/3135; H01L 23/49811; H01L 23/5389; H01L 24/19; H01L 24/20; H01L 24/97; H01L 25/03; H01L 25/50; H01L 21/561; H01L 2224/04105; H01L 2224/12105; H01L 2224/24145; H01L 2224/24227; H01L 2224/32145; H01L 2224/32225; H01L 2224/73267; H01L 2224/83005; H01L 2224/97; H01L 2225/06548; H01L 2225/06568; H01L 2225/06582; H01L 2225/06596; H01L 2924/18162; H01L 2924/3511

See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,806,059 B1* | 10/2017 | Lee | H01L 21/6835 |
| 9,825,007 B1* | 11/2017 | Chen | H01L 21/565 |
| 9,859,245 B1* | 1/2018 | Chen | H01L 21/561 |
| 9,917,072 B2* | 3/2018 | Yu | H01L 23/3107 |
| 9,984,998 B2* | 5/2018 | Yu | H01L 21/78 |
| 10,083,927 B2* | 9/2018 | Chen | H01L 21/486 |
| 10,128,213 B2* | 11/2018 | Yu | H01L 24/05 |
| 10,163,701 B2* | 12/2018 | Lee | H01L 24/19 |
| 10,347,606 B2* | 7/2019 | Yu | H01L 21/486 |
| 10,692,789 B2* | 6/2020 | Liu | H01L 23/3114 |
| 10,734,357 B2* | 8/2020 | Chen | H01L 21/4857 |
| 10,811,394 B2* | 10/2020 | Yu | H01L 21/4853 |
| 10,854,565 B2* | 12/2020 | Chen | H01L 24/18 |
| 2003/0134488 A1 | 7/2003 | Yamazaki et al. | |
| 2006/0125072 A1* | 6/2006 | Mihara | H01L 24/97 257/E21.705 |
| 2010/0178731 A1* | 7/2010 | Mihara | H01L 23/3114 438/107 |
| 2010/0290191 A1* | 11/2010 | Lin | H01L 24/82 361/764 |
| 2011/0291288 A1 | 12/2011 | Wu et al. | |
| 2012/0038064 A1* | 2/2012 | Camacho | H01L 24/81 257/E23.141 |
| 2013/0040423 A1* | 2/2013 | Tung | H01L 21/78 257/E21.602 |
| 2013/0062760 A1 | 3/2013 | Hung et al. | |
| 2013/0062761 A1 | 3/2013 | Lin et al. | |
| 2013/0069222 A1 | 3/2013 | Camacho | |
| 2013/0071969 A1 | 3/2013 | Vodrahalli et al. | |
| 2013/0093078 A1* | 4/2013 | Lin | H01L 21/568 257/737 |
| 2013/0147063 A1 | 6/2013 | Park et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0015131 A1 | 1/2014 | Meyer et al. | |
| 2014/0015145 A1* | 1/2014 | Cho | H01L 24/96 438/109 |
| 2014/0097535 A1* | 4/2014 | He | H01L 25/0652 257/E21.705 |
| 2014/0203429 A1 | 7/2014 | Yu et al. | |
| 2014/0203457 A1* | 7/2014 | Kim | H01L 25/0657 257/778 |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0179624 A1 | 6/2015 | Lin et al. | |
| 2015/0262928 A1 | 9/2015 | Shen et al. | |
| 2015/0303174 A1* | 10/2015 | Yu | H01L 21/6835 438/109 |
| 2016/0013156 A1* | 1/2016 | Zhai | H01L 25/50 438/109 |
| 2016/0086918 A1 | 3/2016 | Lin et al. | |
| 2016/0118273 A1 | 4/2016 | Cho et al. | |
| 2016/0148904 A1* | 5/2016 | Zhai | H01L 24/96 438/109 |
| 2016/0260684 A1* | 9/2016 | Zhai | H01L 25/0652 |
| 2016/0260695 A1* | 9/2016 | Chung | H01L 21/6835 |
| 2016/0300813 A1* | 10/2016 | Zhai | H01L 24/97 |
| 2016/0307872 A1* | 10/2016 | Chen | H01L 21/565 |
| 2016/0315071 A1* | 10/2016 | Zhai | H01L 24/73 |
| 2016/0329299 A1 | 11/2016 | Lin et al. | |
| 2016/0358889 A1 | 12/2016 | Lai et al. | |
| 2017/0033080 A1 | 2/2017 | Chen et al. | |
| 2017/0084555 A1 | 3/2017 | Yu et al. | |
| 2017/0084576 A1* | 3/2017 | Yu | H01L 21/31053 |
| 2017/0098629 A1* | 4/2017 | Liu | H01L 23/3114 |
| 2017/0133351 A1 | 5/2017 | Su et al. | |
| 2017/0194292 A1 | 7/2017 | Yu et al. | |
| 2017/0243855 A1 | 8/2017 | Kim | |
| 2017/0287870 A1* | 10/2017 | Fang | H01L 23/552 |
| 2017/0287874 A1* | 10/2017 | Fang | H01L 24/11 |
| 2018/0026019 A1 | 1/2018 | Tao et al. | |
| 2018/0053746 A1 | 2/2018 | Yu et al. | |
| 2018/0122764 A1 | 5/2018 | Chen et al. | |
| 2018/0138083 A1* | 5/2018 | Kim | H01L 21/76877 |
| 2018/0151530 A1 | 5/2018 | Chen et al. | |
| 2018/0277520 A1 | 9/2018 | Yu et al. | |
| 2019/0006309 A1 | 1/2019 | Jeng et al. | |
| 2019/0027454 A1 | 1/2019 | Chen et al. | |
| 2019/0074261 A1 | 3/2019 | Yu et al. | |
| 2020/0075542 A1 | 3/2020 | Sung et al. | |
| 2020/0194404 A1* | 6/2020 | Chen | H01L 24/19 |

* cited by examiner

CHIP PACKAGE STRUCTURE WITH MOLDING LAYER

CROSS REFERENCE

This application is a Divisional of U.S. application Ser. No. 15/801,846, filed on Nov. 2, 2017, which is a Divisional of U.S. application Ser. No. 15/208,764, filed on Jul. 13, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1C-1 and 1H-1 are top views of the chip package structure of FIGS. 1C and 1H, in accordance with some embodiments.

FIGS. 2B-1 and 2H-1 are top views of the chip package structure of FIGS. 2B and 2H, in accordance with some embodiments.

DETAILED DESCRIPTION

Figure 1A:
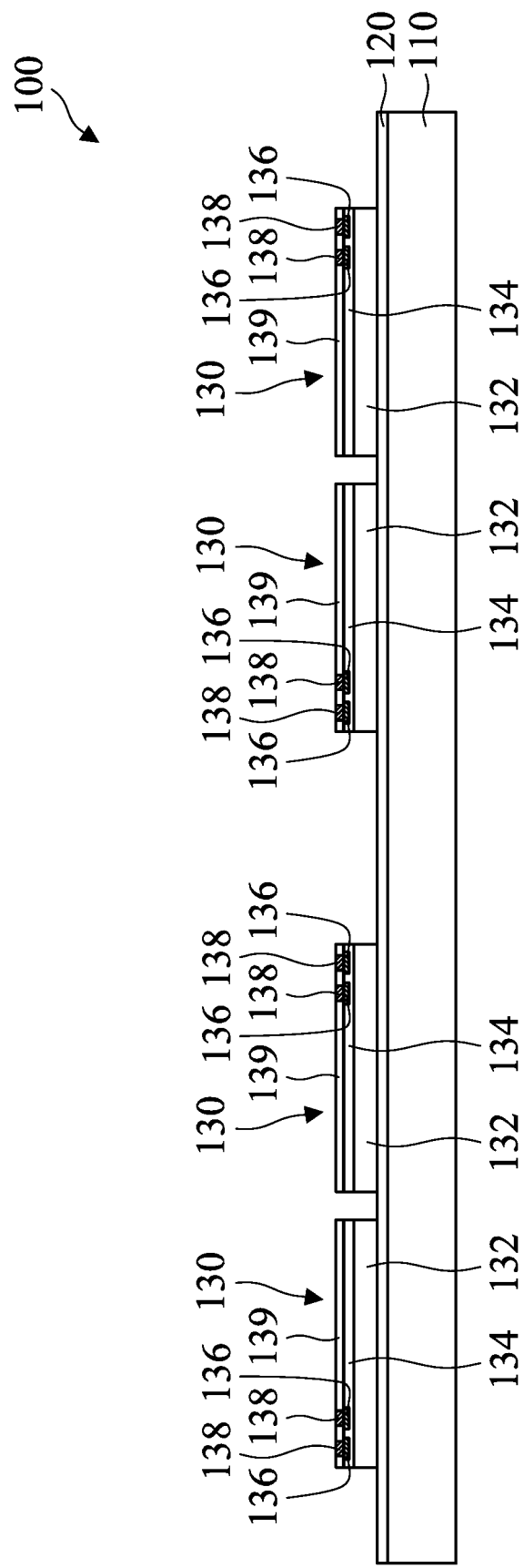
FIGS. 1A-1H are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
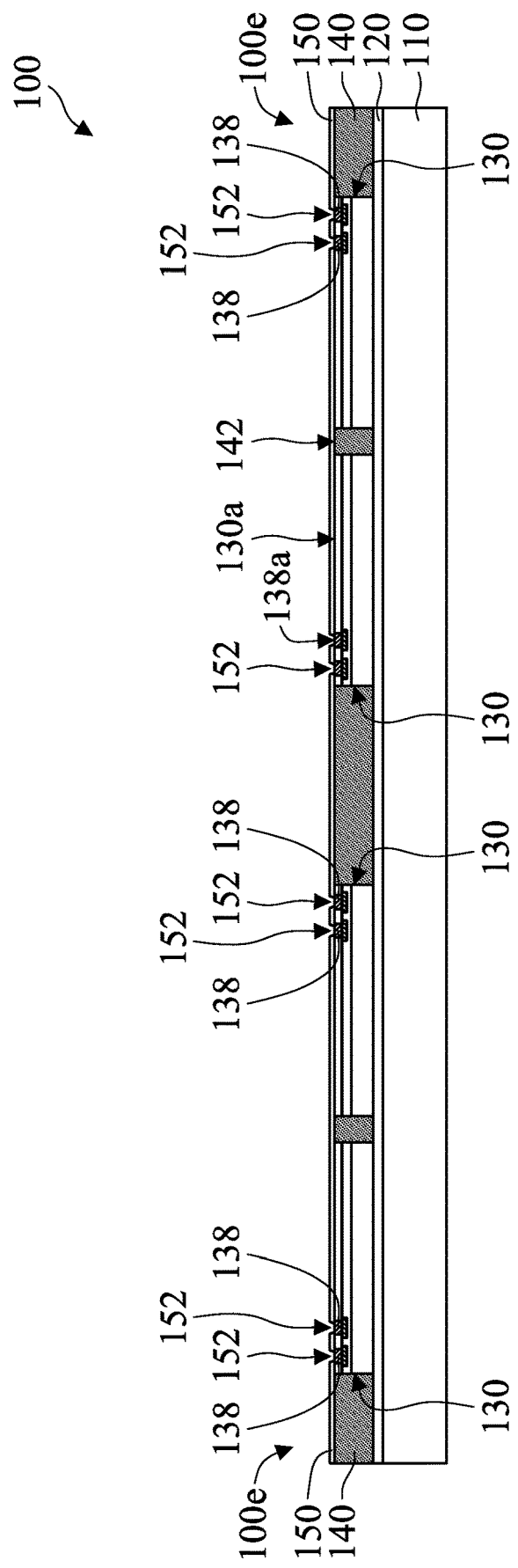
Figure 1C:
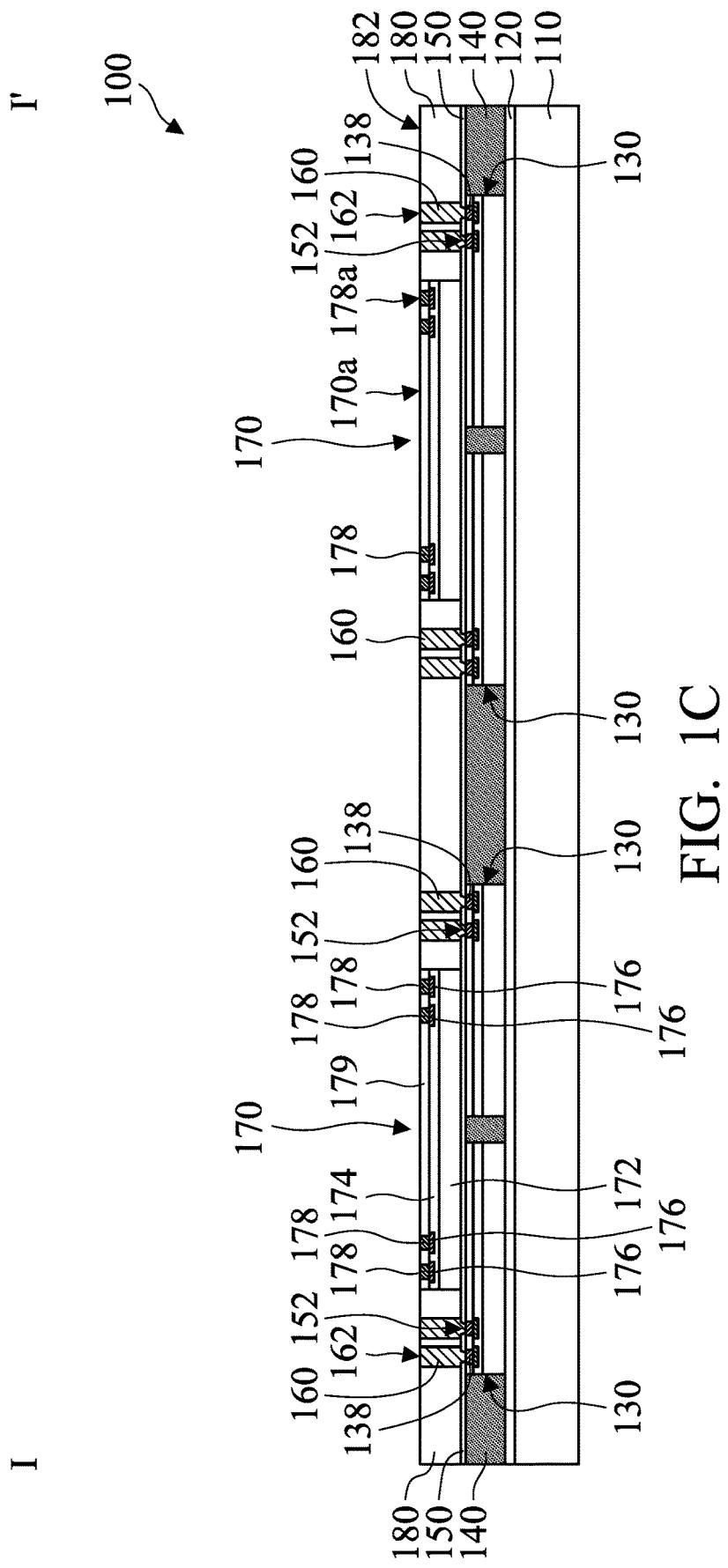
Figures 1, 1C:
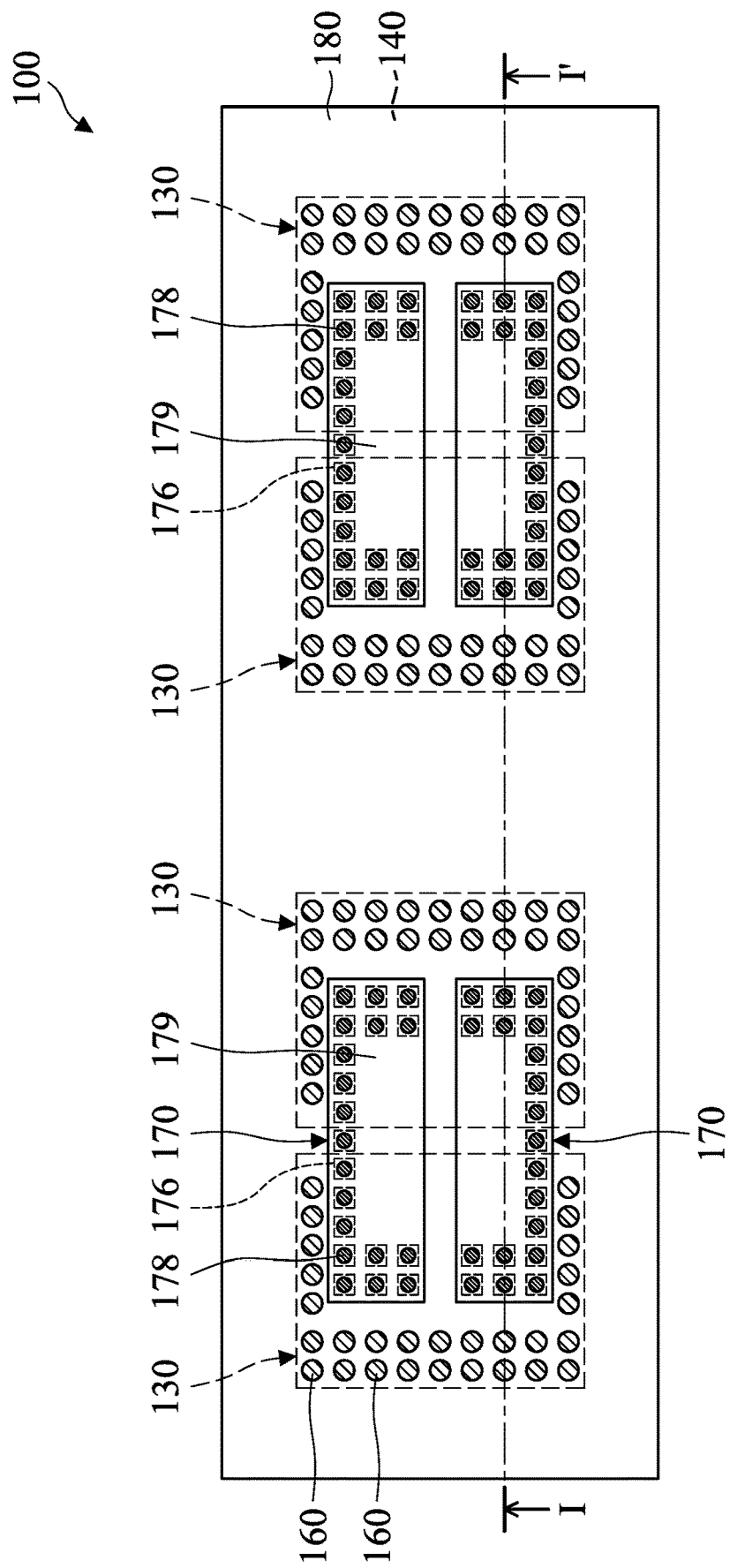
Figure 1D:
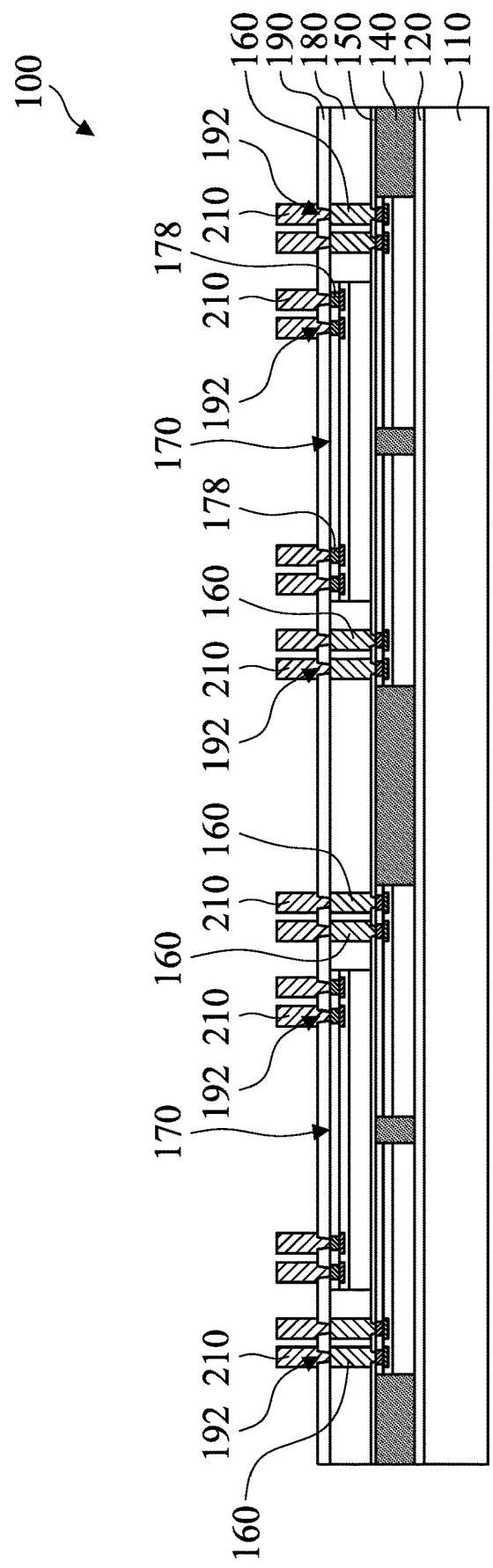
Figure 1E:
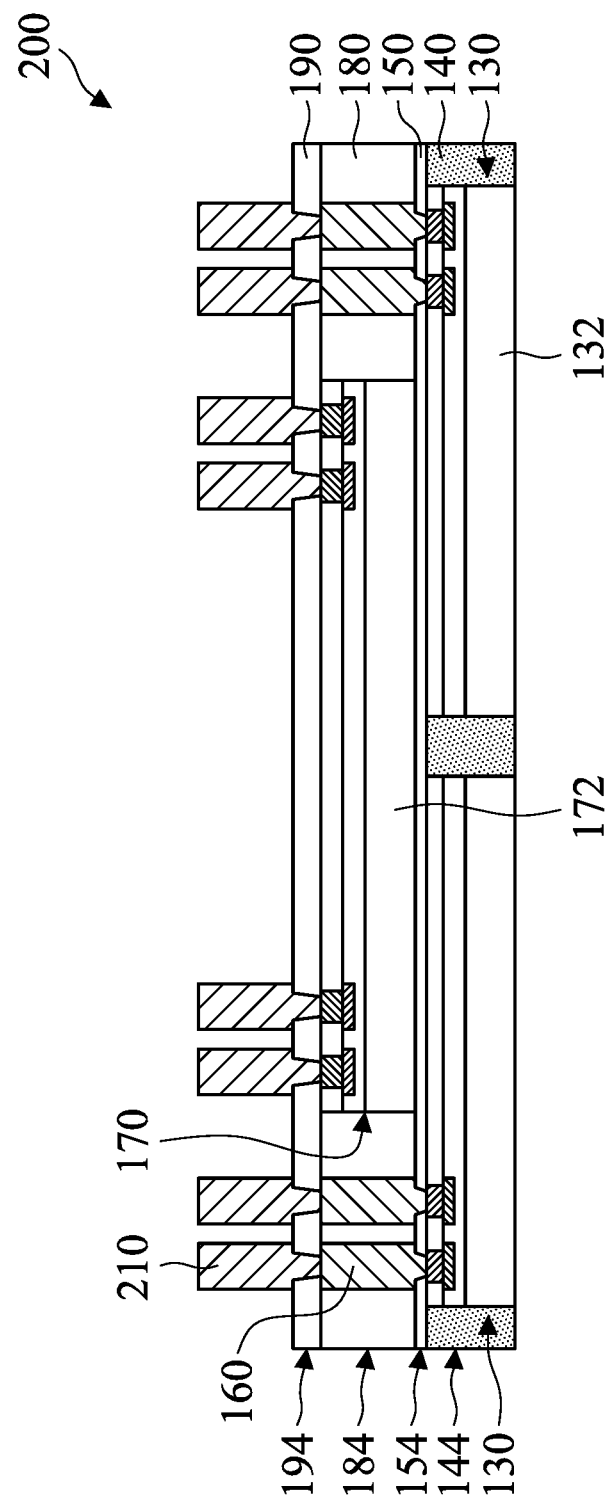
Figure 1F:
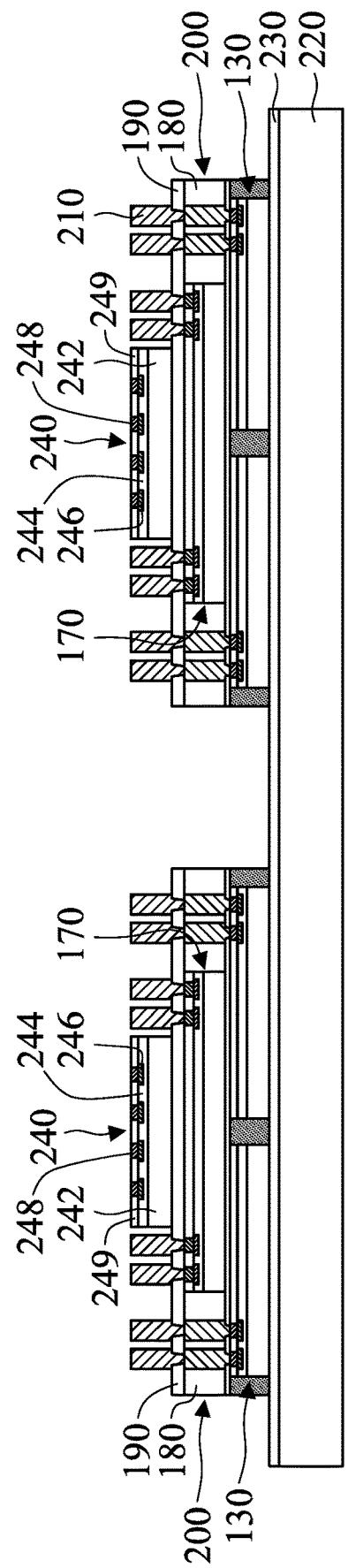
Figure 1G:
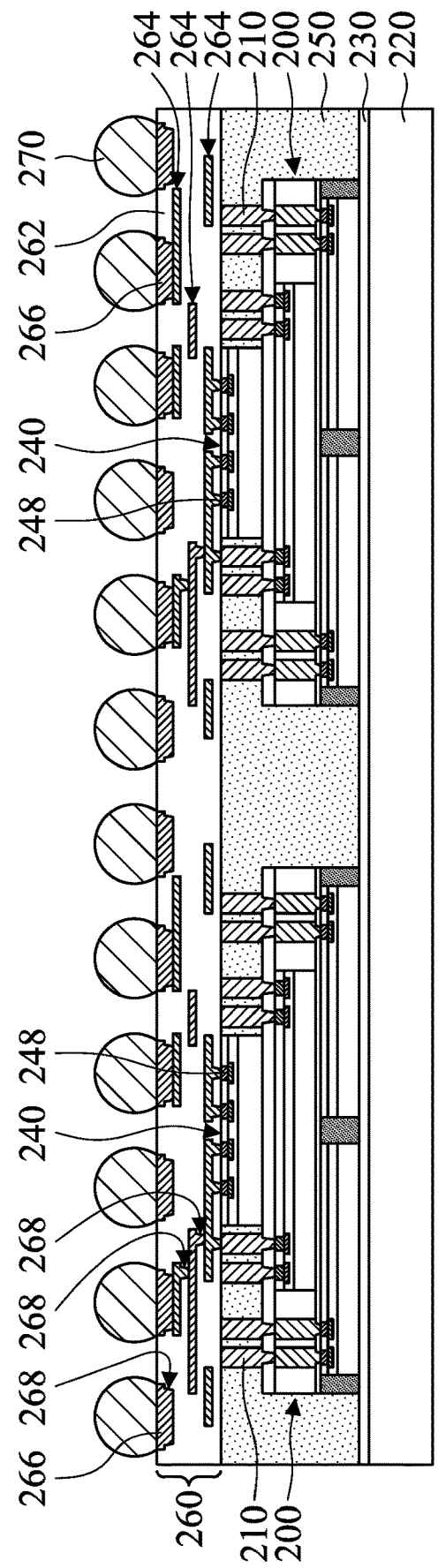
Figure 1H:
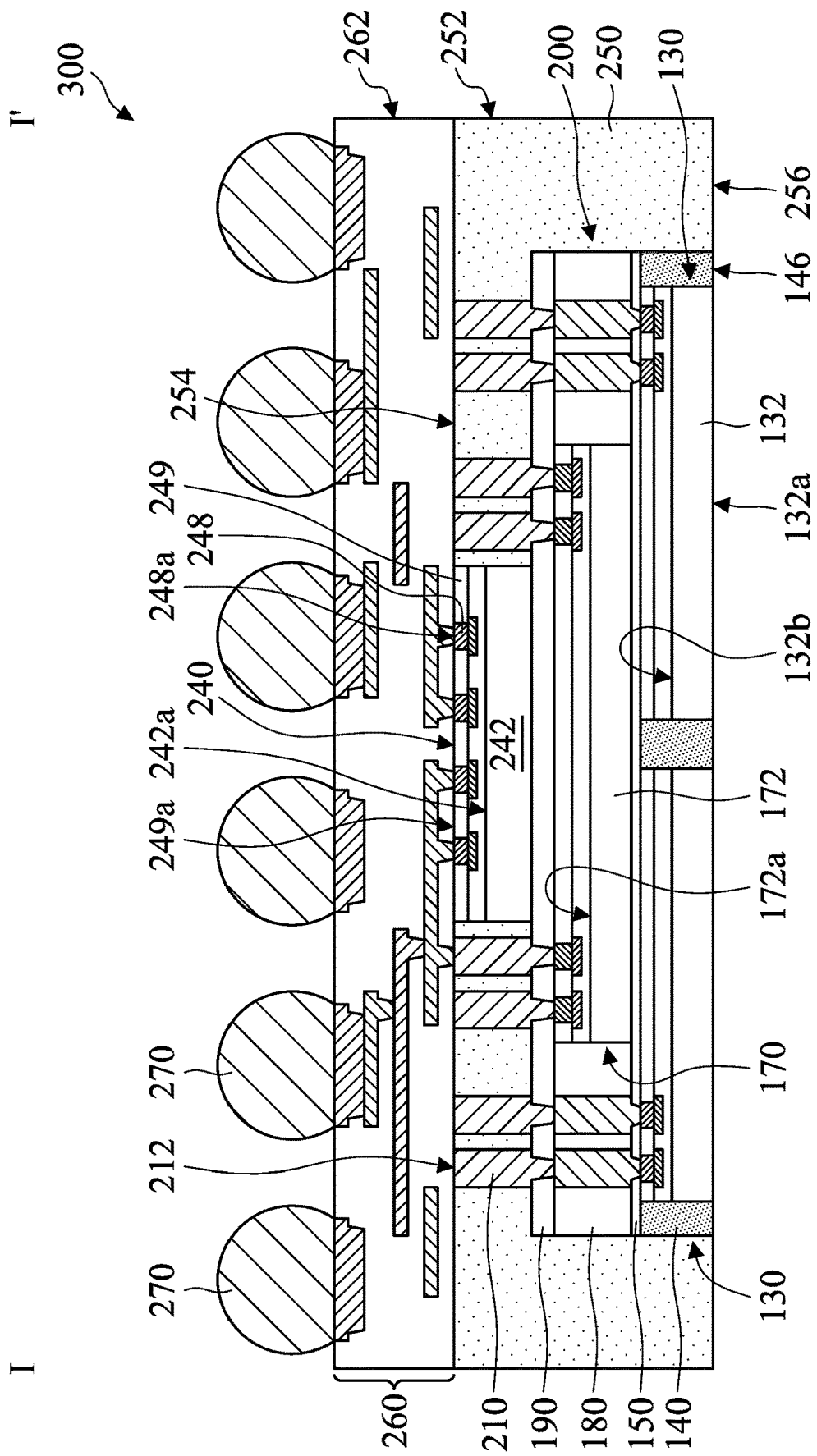
Figures 1, 1H:
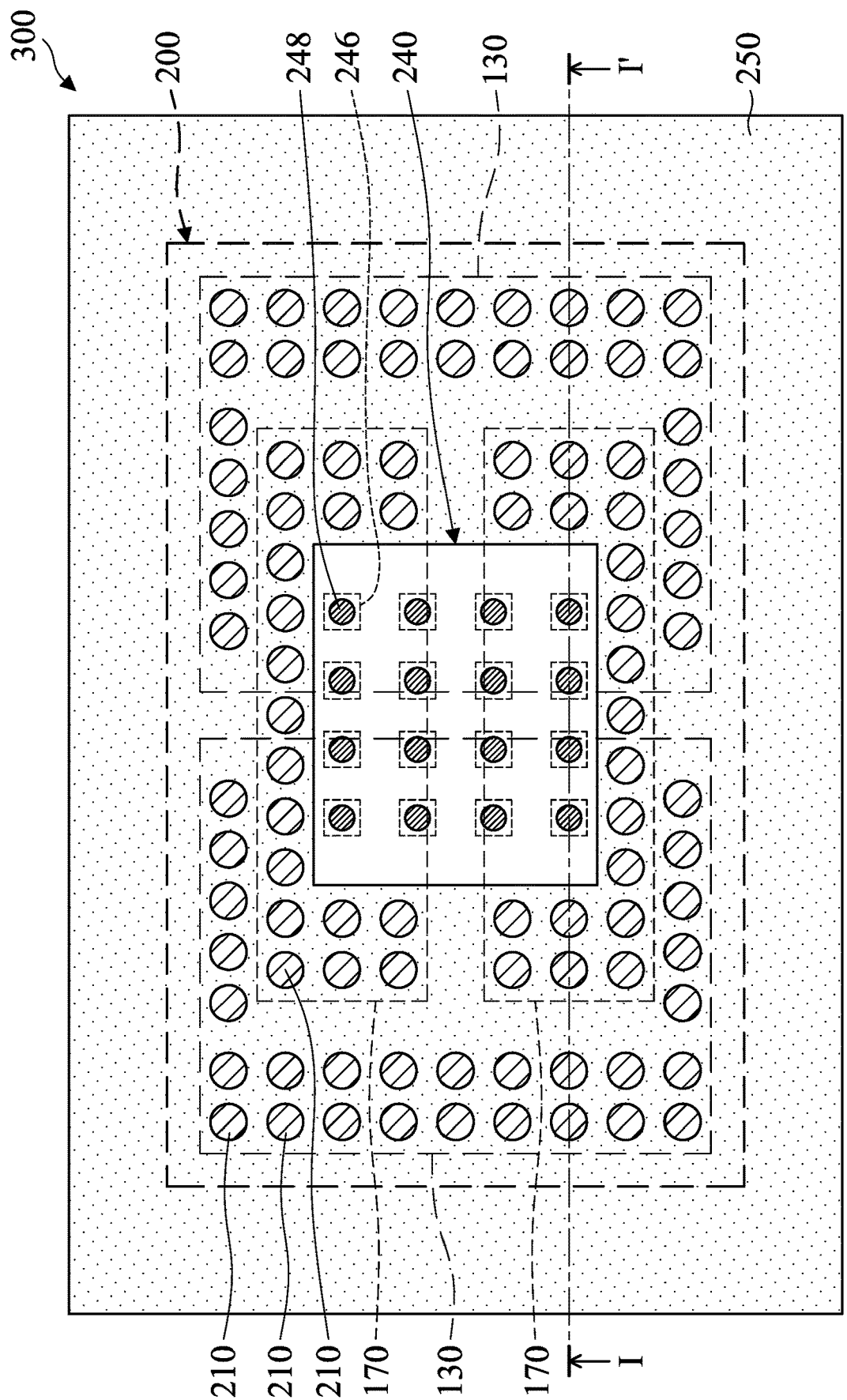

FIGS. 1A-1H are cross-sectional views of various stages of a process for forming a chip package structure, in accordance with some embodiments. FIGS. 1C-1 and 1H-1 are top views of the chip package structure of FIGS. 1C and 1H, in accordance with some embodiments. FIG. 1C is a cross-sectional view illustrating the package 100 along a sectional line I-I' in FIG. 1C-1, in accordance with some embodiments. FIG. 1H is a cross-sectional view illustrating the chip package structure 300 along a sectional line I-I' in FIG. 1H-1, in accordance with some embodiments.

As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, a combination thereof, and/or the like, in accordance with some embodiments. The carrier substrate 110 includes a wafer, in accordance with some embodiments.

As shown in FIG. 1A, an adhesive layer 120 is formed over the carrier substrate 110, in accordance with some embodiments. The adhesive layer 120 includes any suitable adhesive material, such as a polymer material, in accordance with some embodiments. For example, the adhesive layer 120 includes an ultraviolet (UV) glue, which loses its adhesive property when exposed to UV light, in accordance with some embodiments. In some embodiments, the adhesive layer 120 includes a double sided adhesive tape. The adhesive layer 120 is formed using a lamination process, a spin coating process, or another suitable process.

As shown in FIG. 1A, chip structures 130 are provided over the adhesive layer 120, in accordance with some embodiments. Each of the chip structures 130 includes a chip 132, a dielectric layer 134, bonding pads 136, interconnection structures 138, and a passivation layer 139, in accordance with some embodiments. The dielectric layer 134 is formed over the chip 132, in accordance with some embodiments.

The dielectric layer 134 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 134 is formed using a CVD process, a HDPCVD process, a spin-on process, a sputtering process, or a combination thereof, in accordance with some embodiments.

The bonding pads 136 are formed in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments. The passivation layer 139 includes a polymer material or another suitable insulating material.

As shown in FIG. 1B, a molding layer 140 is formed over the carrier substrate 110 and the adhesive layer 120, in accordance with some embodiments. The molding layer 140 surrounds the chip structures 130, in accordance with some embodiments. In some embodiments, portions of the molding layer 140 are located between the chip structures 130. The molding layer 140 includes a polymer material or another suitable insulating material. The carrier substrate 110 and the molding layer 140 are made of different materials, in accordance with some embodiments.

The formation of the molding layer 140 includes forming a molding compound material layer over the adhesive layer 120; performing a curing process to cross-link (or thermoset) the polymers of the molding compound material layer; performing a grinding process over the molding compound material layer until the interconnection structures 138 are exposed, in accordance with some embodiments. Therefore, top surfaces 138a, 130a, and 142 of the interconnection structures 138, the chip structures 130, and the molding layer 140 are coplanar, in accordance with some embodiments.

As shown in FIG. 1B, an insulating layer 150 is formed over the molding layer 140 and the chip structures 130, in accordance with some embodiments. The insulating layer 150 is a continuous layer, in accordance with some embodiments. The insulating layer 150 has holes 152 over the interconnection structures 138, in accordance with some embodiments. The holes 152 respectively expose the interconnection structures 138 thereunder, in accordance with some embodiments.

Due to varying coefficients of thermal expansion (CTEs) of different elements of the package 100, the package 100 tends to warp (or bow) upwardly at the edges 100e of the package 100, in accordance with some embodiments. Therefore, for eliminating or reducing the warpage of the package 100, the coefficient of thermal expansion of the material of the carrier substrate 110 is less than the coefficient of thermal expansion of the material of the molding layer 140, in accordance with some embodiments.

As shown in FIGS. 1C and 1C-1, conductive pillars 160 are formed in and over the holes 152 to be electrically connected to the interconnection structures 138, respectively, in accordance with some embodiments. The conductive pillars 160 include copper or another suitable conductive material.

As shown in FIGS. 1C and 1C-1, chip structures 170 are provided over the insulating layer 150, in accordance with some embodiments. The chip structures 170 are positioned over the chip structures 130 and the molding layer 140, in accordance with some embodiments.

In some embodiments, a portion of each of the chip structures 130 is exposed by the chip structures 170. The chip structures 170 are between the conductive pillars 160, in accordance with some embodiments. The conductive pillars 160 surround the chip structures 170, in accordance with some embodiments.

Each of the chip structures 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The dielectric layer 174 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 174 is formed using a CVD process, a HDPCVD process, a spin-on process, a sputtering process, or a combination thereof, in accordance with some embodiments.

The bonding pads 176 are formed in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

As shown in FIGS. 1C and 1C-1, a molding layer 180 is formed over the insulating layer 150, in accordance with some embodiments. The insulating layer 150 separates the molding layer 140 and the chip structures 130 from the molding layer 180 and the chip structures 170, in accordance with some embodiments. The molding layer 180 is over the chip structures 130 and the molding layer 140, in accordance with some embodiments.

The molding layer 180 surrounds the chip structures 170 and the conductive pillars 160, in accordance with some embodiments. In some embodiments, portions of the molding layer 180 are between the chip structures 170 and the conductive pillars 160. The molding layer 180 includes a polymer material or another suitable insulating material.

The formation of the molding layer 180 includes forming a molding compound material layer over the insulating layer 150; performing a curing process to cross-link (or thermoset) the polymers of the molding compound material layer; performing a grinding process over the molding compound material layer until the conductive pillars 160 and the interconnection structures 178 are exposed, in accordance with some embodiments.

Therefore, top surfaces 178a, 170a, 162, and 182 of the interconnection structures 178, the chip structures 170, the conductive pillars 160, and the molding layer 180 are coplanar, in accordance with some embodiments. The conductive pillars 160 pass through the molding layer 180, in accordance with some embodiments.

As shown in FIG. 1D, an insulating layer 190 is formed over the molding layer 180 and the chip structures 170, in accordance with some embodiments. The insulating layer 190 has holes 192 over the conductive pillars 160 and the interconnection structures 178, in accordance with some embodiments. The holes 192 respectively expose the conductive pillars 160 thereunder and the interconnection structures 178 thereunder, in accordance with some embodiments.

As shown in FIG. 1D, conductive pillars 210 are formed in and over the holes 192 to be electrically connected to the conductive pillars 160 and the interconnection structures 178, respectively, in accordance with some embodiments. The conductive pillars 210 include copper or another suitable conductive material.

As shown in FIG. 1E, the chip structures 130 and the molding layer 140 are debonded from the carrier substrate 110, in accordance with some embodiments. The debonding process includes performing a thermal process over the adhesive layer 120, in accordance with some embodiments. For example, the adhesive layer 120 is irradiated with UV light to weaken the adhesive properties of the adhesive layer 120.

As shown in FIG. 1E, a sawing process is performed over the insulating layer 190, the molding layer 180, the insulating layer 150, and the molding layer 140 to form individual chip package structures 200, in accordance with some embodiments. Each of the chip package structures 200 includes the chip structures 130, the molding layer 140, the insulating layer 150, the conductive pillars 160, the chip structures 170, the molding layer 180, the insulating layer 190, and the conductive pillars 210, in accordance with some embodiments.

In each of the chip package structures 200, side walls 194, 184, 154, and 144 of the insulating layer 190, the molding layer 180, the insulating layer 150, and the molding layer 140 are coplanar, in accordance with some embodiments. The molding layers 140 and 180 together form a molding structure, in accordance with some embodiments.

As shown in FIG. 1F, a carrier substrate 220 is provided, in accordance with some embodiments. The carrier substrate 220 is configured to provide temporary mechanical and structural support during subsequent processing steps, in accordance with some embodiments. The carrier substrate 220 includes glass, silicon oxide, aluminum oxide, a combination thereof, and/or the like, in accordance with some embodiments. The carrier substrate 220 includes a wafer, in accordance with some embodiments.

As shown in FIG. 1F, an adhesive layer 230 is formed over the carrier substrate 220, in accordance with some embodiments. The adhesive layer 230 includes any suitable adhesive material, such as a polymer material, in accordance with some embodiments.

For example, the adhesive layer 230 includes an ultraviolet (UV) glue, which loses its adhesive property when exposed to UV light, in accordance with some embodiments. In some embodiments, the adhesive layer 230 includes a double sided adhesive tape. The adhesive layer 230 is formed using a lamination process, a spin coating process, or another suitable process.

As shown in FIG. 1F, the chip package structures 200 are disposed over the adhesive layer 230, in accordance with some embodiments. As shown in FIG. 1F, chip structures 240 are provided over the chip package structures 200, respectively, in accordance with some embodiments.

The chip structure 240 is over the chip structures 170 and the molding layer 180 of one of the chip package structures 200, in accordance with some embodiments. The insulating layer 190 separates the chip structures 170 thereunder from the chip structure 240 thereover, in accordance with some embodiments.

Each of the chip structures 240 includes a chip 242, a dielectric layer 244, bonding pads 246, interconnection structures 248, and a passivation layer 249, in accordance with some embodiments. The dielectric layer 244 is formed over the chip 242, in accordance with some embodiments.

The dielectric layer 244 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The dielectric layer 244 is formed using a CVD process, a HDPCVD process, a spin-on process, a sputtering process, or a combination thereof, in accordance with some embodiments. The bonding pads 246 are formed in the dielectric layer 244, in accordance with some embodiments. The bonding pads 246 are electrically connected to devices (not shown) formed in/over the chip 242, in accordance with some embodiments.

The interconnection structures 248 are formed over the bonding pads 246 respectively, in accordance with some embodiments. The interconnection structures 248 include conductive pillars or conductive bumps, in accordance with some embodiments. The passivation layer 249 is formed over the dielectric layer 244 and surrounds the interconnection structures 248, in accordance with some embodiments. The passivation layer 249 includes a polymer material or another suitable insulating material.

As shown in FIG. 1G, a molding layer 250 is formed over the adhesive layer 230 and the chip package structures 200, in accordance with some embodiments. The molding layer 250 surrounds the chip package structures 200 and the chip structures 240, in accordance with some embodiments. The molding layer 250 includes a polymer material or another suitable insulating material.

The carrier substrate 110 and the molding layer 250 are made of different materials, in accordance with some embodiments. For eliminating or reducing the warpage of the package of FIG. 1G, the coefficient of thermal expansion of the material of the carrier substrate 110 is less than the coefficient of thermal expansion of the material of the molding layer 250, in accordance with some embodiments.

The formation of the molding layer 250 includes forming a molding compound material layer over the adhesive layer 230 and the chip package structures 200; performing a curing process to cross-link (or thermoset) the polymers of the molding compound material layer; performing a grinding process over the molding compound material layer until the interconnection structures 248 are exposed, in accordance with some embodiments.

As shown in FIG. 1G, a wiring structure 260 is formed over the molding layer 250, the chip structures 240, and the chip package structures 200, in accordance with some embodiments. The wiring structure 260 includes a dielectric layer 262, wiring layers 264, conductive pads 266, and conductive vias 268, in accordance with some embodiments. The wiring layers 264 and conductive vias 268 are in the dielectric layer 262, in accordance with some embodiments. The conductive pads 266 are over the dielectric layer 262, in accordance with some embodiments.

The conductive vias 268 are between the conductive pads 266, the wiring layers 264, the conductive pillars 210, and the interconnection structures 248, in accordance with some embodiments. Therefore, the conductive pads 266, the wiring layers 264, the conductive pillars 210, and the interconnection structures 248 are able to be electrically connected to each other through the conductive vias 268 according to design requirements, in accordance with some embodiments.

As shown in FIG. 1G, conductive bumps 270 are formed over the conductive pads 266, respectively, in accordance with some embodiments. The conductive bumps 270 include tin (Sn) or another suitable conductive material. The formation of the conductive bumps 270 includes forming a solder paste over the conductive pads 266 and reflowing the solder paste, in accordance with some embodiments.

As shown in FIGS. 1H and 1H-1, the chip package structures 200 and the molding layer 250 are debonded from the carrier substrate 220, in accordance with some embodiments. The debonding process includes performing a thermal process over the adhesive layer 230, in accordance with some embodiments. For example, the adhesive layer 230 is irradiated with UV light to weaken the adhesive properties of the adhesive layer 230.

As shown in FIGS. 1H and 1H-1, a sawing process is performed over the wiring structure 260 and the molding layer 250 to form individual chip package structures 300, in accordance with some embodiments. For the sake of simplicity, the conductive bumps 270 and the wiring structure 260 are omitted in FIG. 1H-1, in accordance with some embodiments.

Each of the chip package structures 300 includes the chip package structure 200, the chip structure 240, the molding layer 250, the wiring structure 260, and the conductive bumps 270, in accordance with some embodiments. In the chip package structure 300, side walls 262 and 252 of the wiring structure 260 and the molding layer 250 are coplanar, in accordance with some embodiments.

In the chip package structure 300, top surfaces 212, 254, 249a, and 248a of the conductive pillars 210, the molding layer 250, the passivation layer 249, and the interconnection structures 248 are coplanar, in accordance with some embodiments. The conductive pillars 210 pass through the molding layer 250, in accordance with some embodiments. The molding layer 250 continuously surrounds the entire chip package structures 200 and the entire chip structure 240, in accordance with some embodiments. The molding layer 250 is a single layer structure, in accordance with some embodiments.

In some embodiments, a bottom surface 132a of the chip 132, a bottom surface 146 of the molding layer 140, and a bottom surface 256 of the molding layer 250 are coplanar. The molding layer 250 surrounds the insulating layers 190 and 150, in accordance with some embodiments. The molding layer 140 does not cover top surfaces 132b of the chips 132, in accordance with some embodiments. The molding layer 140 does not cover bottom surfaces 132a of the chips 132, in accordance with some embodiments.

The molding layer 180 does not cover top surfaces 172a of the chips 172, in accordance with some embodiments. The molding layer 250 does not cover a top surface 242a of the chip 242, in accordance with some embodiments. The chip package structure 300 is a fan-out chip package structure, in accordance with some embodiments.

The process of FIGS. 1A-1H includes performing a sawing process to form individual chip package structures 200; disposing the chip package structures 200 over the carrier substrate 220; forming the molding layer 250 over the adhesive layer 230 and the chip package structures 200; removing the carrier substrate 220; and performing a sawing process to form the individual chip package structures 300, in accordance with some embodiments.

Therefore, during the process of FIGS. 1A-1H, the warpage of the chip package structure 300 is eliminated or reduced twice by selecting the materials of the molding layer 140 and the carrier substrate 110 and the materials of the molding layer 250 and the carrier substrate 220, in accordance with some embodiments. As a result, the warpage of the chip package structure 300 is reduced to an acceptable level, in accordance with some embodiments. Therefore, the yield of the chip package structures 300 is improved, in accordance with some embodiments.

Since the sawing process of FIG. 1E and the disposing of the chip package structures 200 over the carrier substrate 220 of FIG. 1F are performed, the chip package structure 200 is smaller than the chip package structure 300. Therefore, if the carrier substrates 110 and 220 have the same size (e.g. a wafer size), the number of the chip package structures 200 over the carrier substrate 110 is greater than the number of the chip package structures 300 over the carrier substrate 220. Therefore, the cost of the process of forming the chip package structures 200 is reduced, in accordance with some embodiments.

In some embodiments, an electrical property test (e.g. a final test) is performed over the conductive pillars 210 of FIG. 1D to identify known good dies (KGDs). Thereafter, in the step of FIG. 1F, the chip package structures 200 with the known good dies are picked up and disposed over the carrier substrate 220 to form the chip package structures 300, in accordance with some embodiments.

Therefore, the process of FIGS. 1A-1H prevents the chip package structures 300 from having the chip package structures 200 with bad dies, in accordance with some embodiments. Therefore, the yield of the chip package structures 300 is improved, in accordance with some embodiments.

Figure 2A:
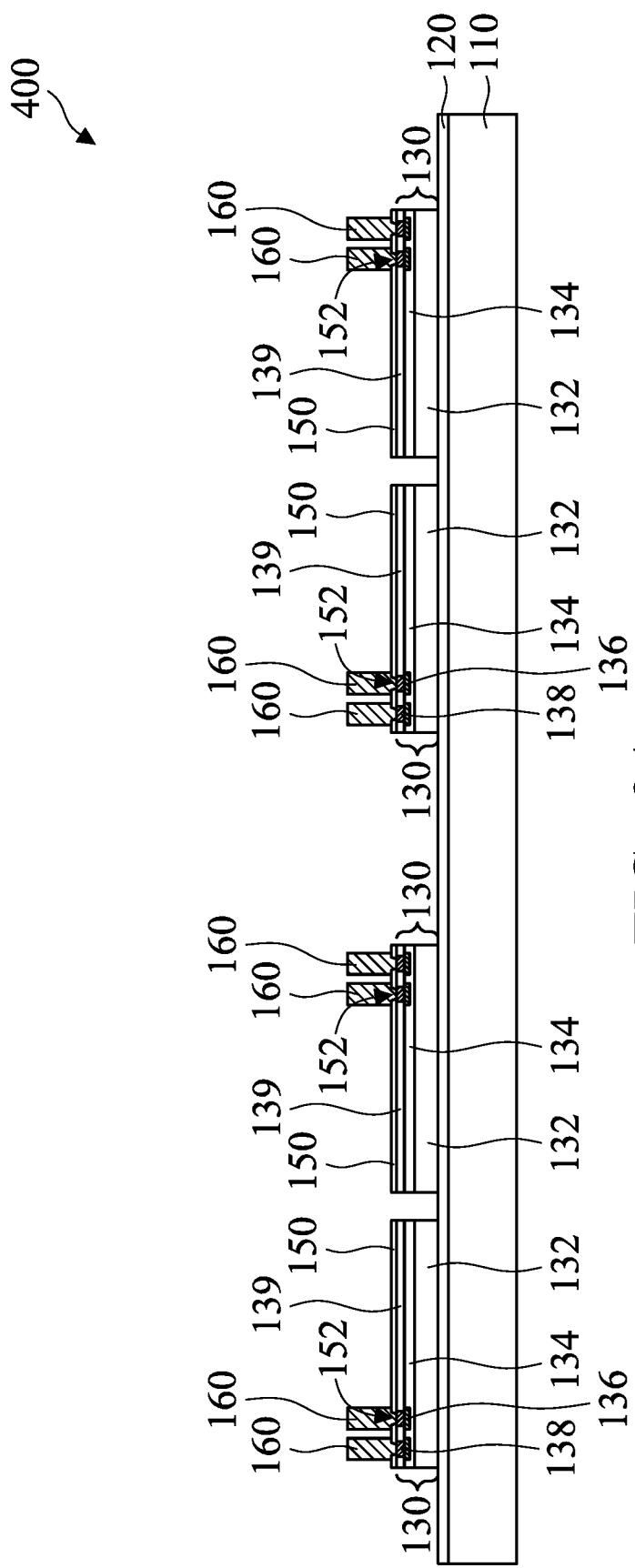
FIGS. 2A-2H are cross-sectional views of various stages of a process for forming a chip package structure, in accordance with some embodiments.
Figure 2B:
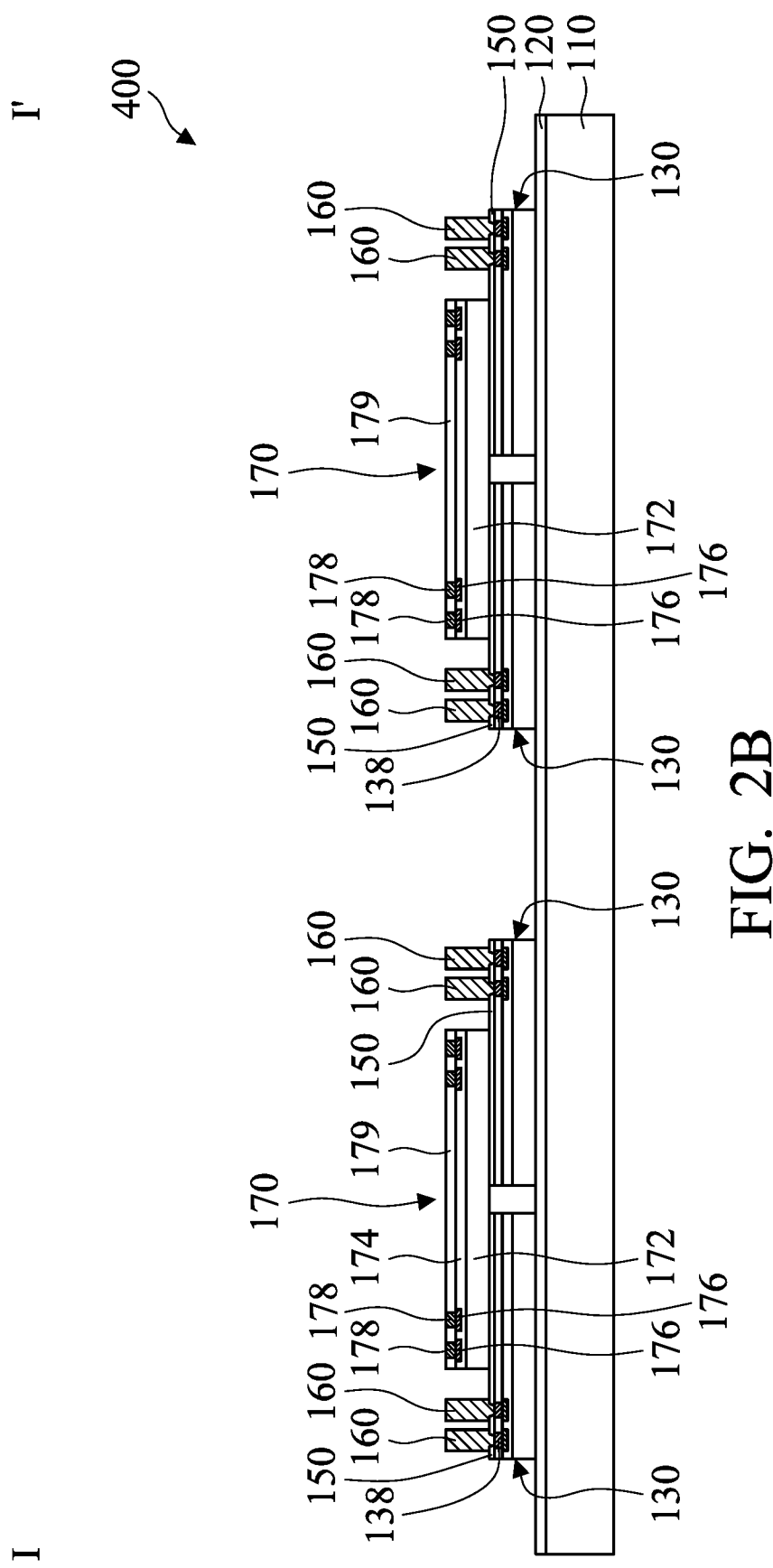
Figures 1, 2B:
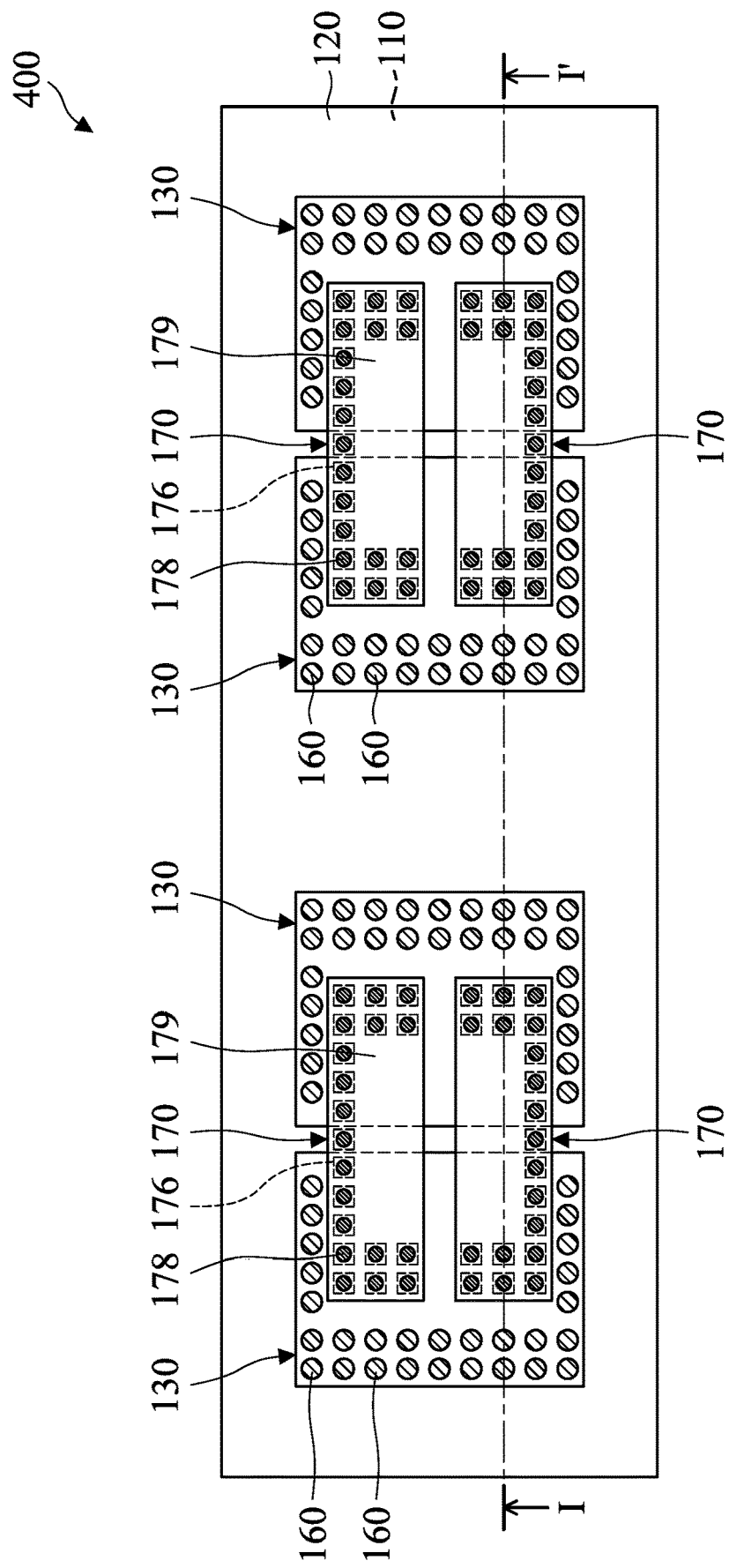
Figure 2C:
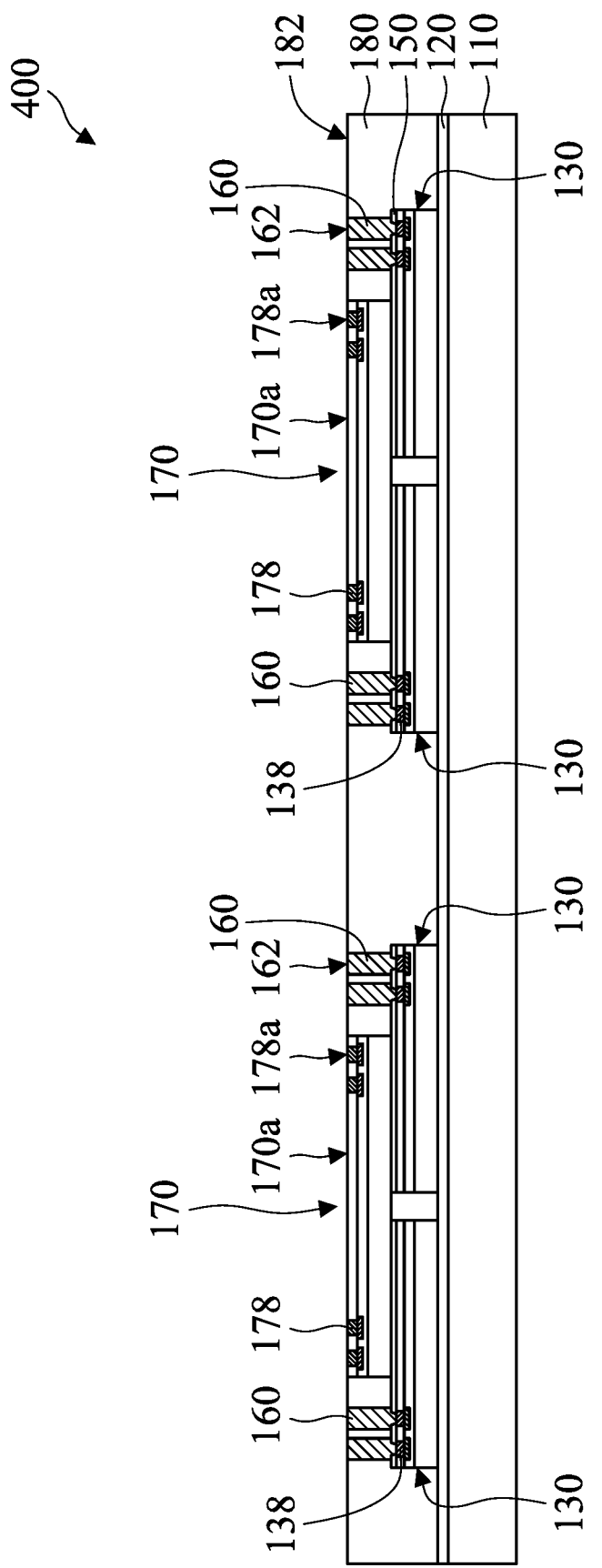
Figure 2D:
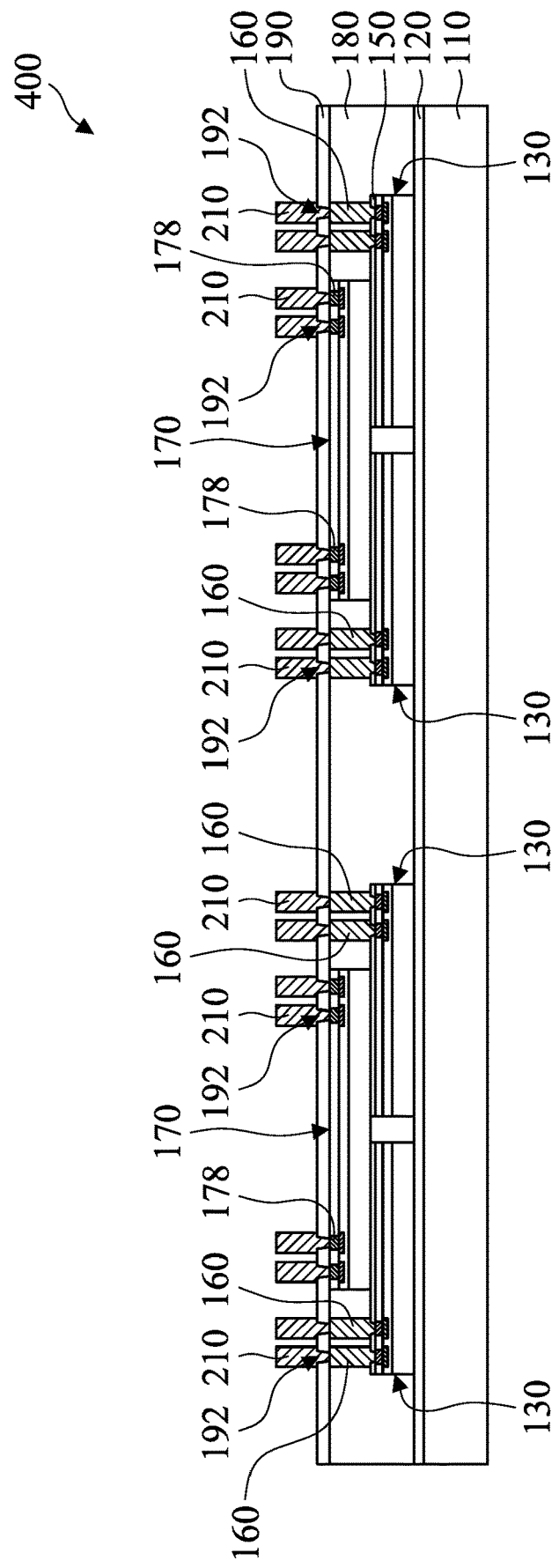
Figure 2E:
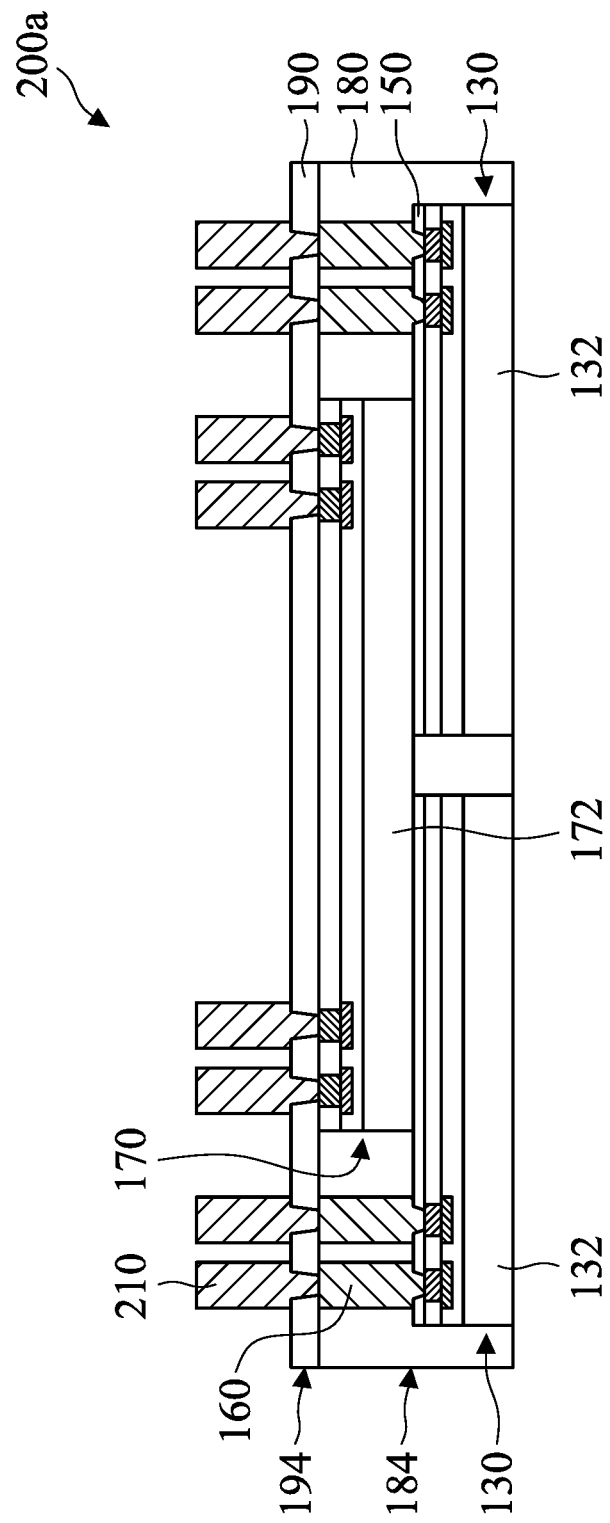
Figure 2F:
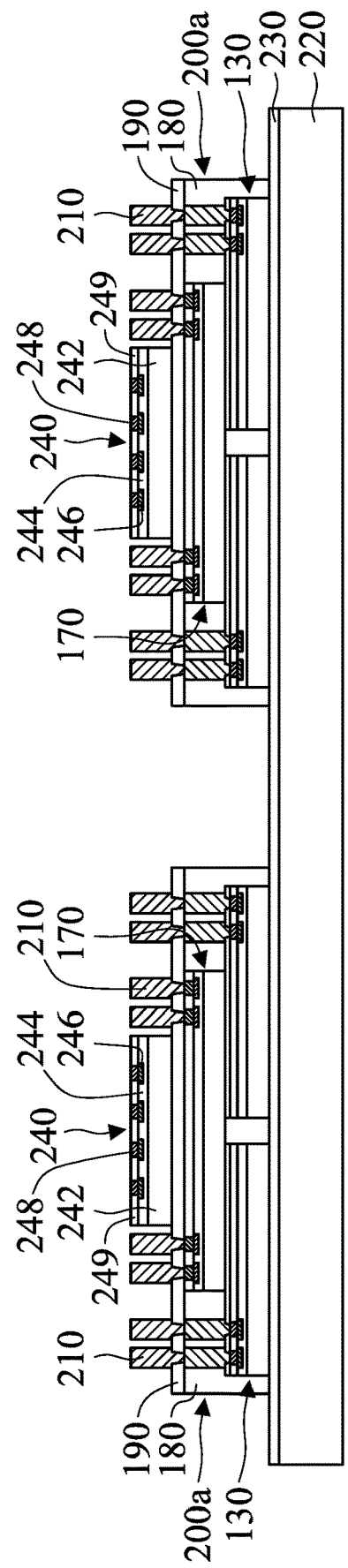
Figure 2G:
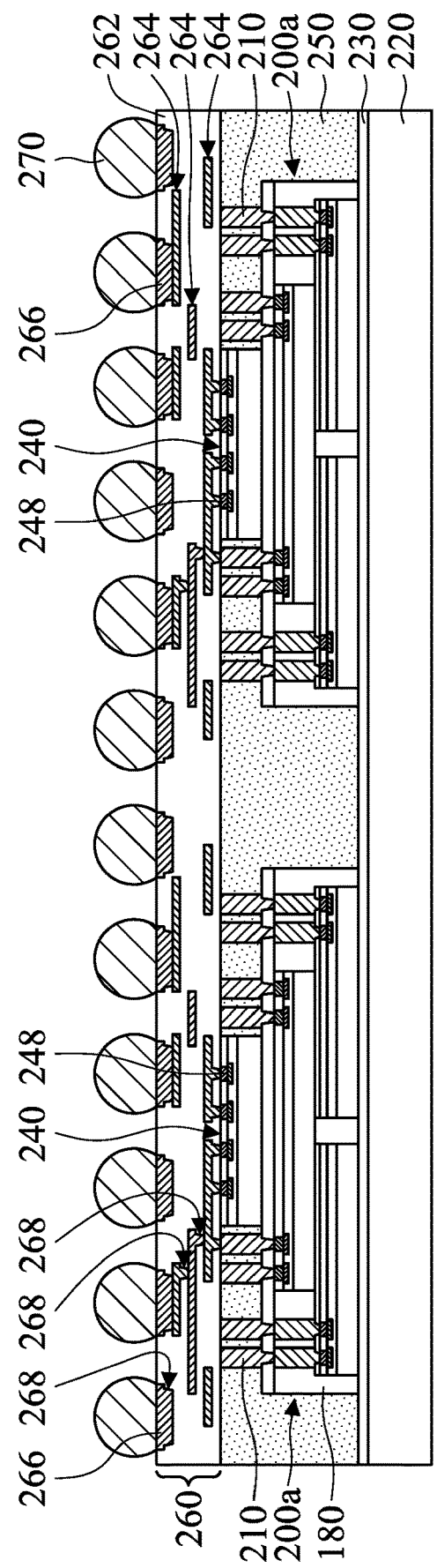
Figure 2H:
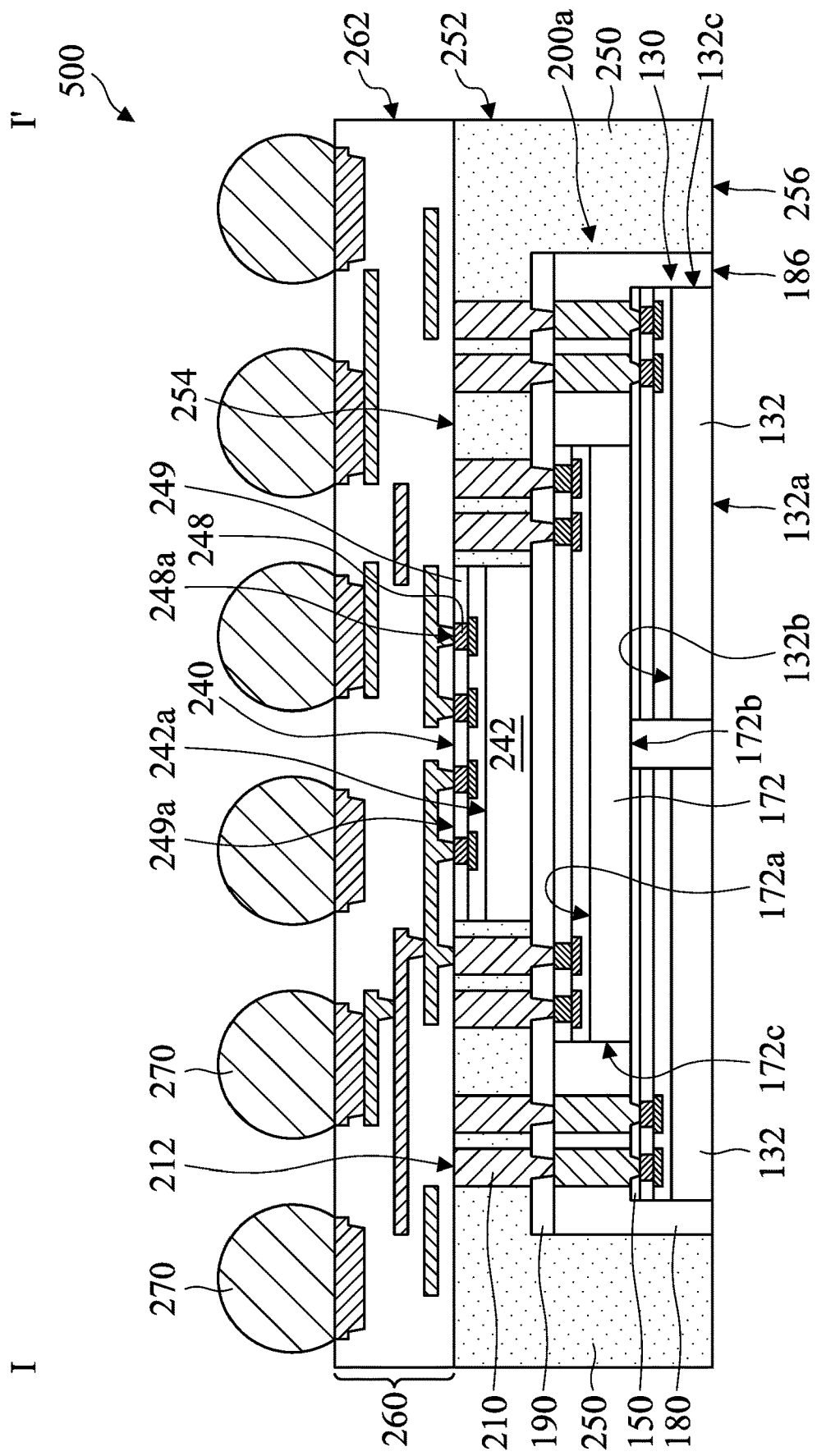
Figures 1, 2H:
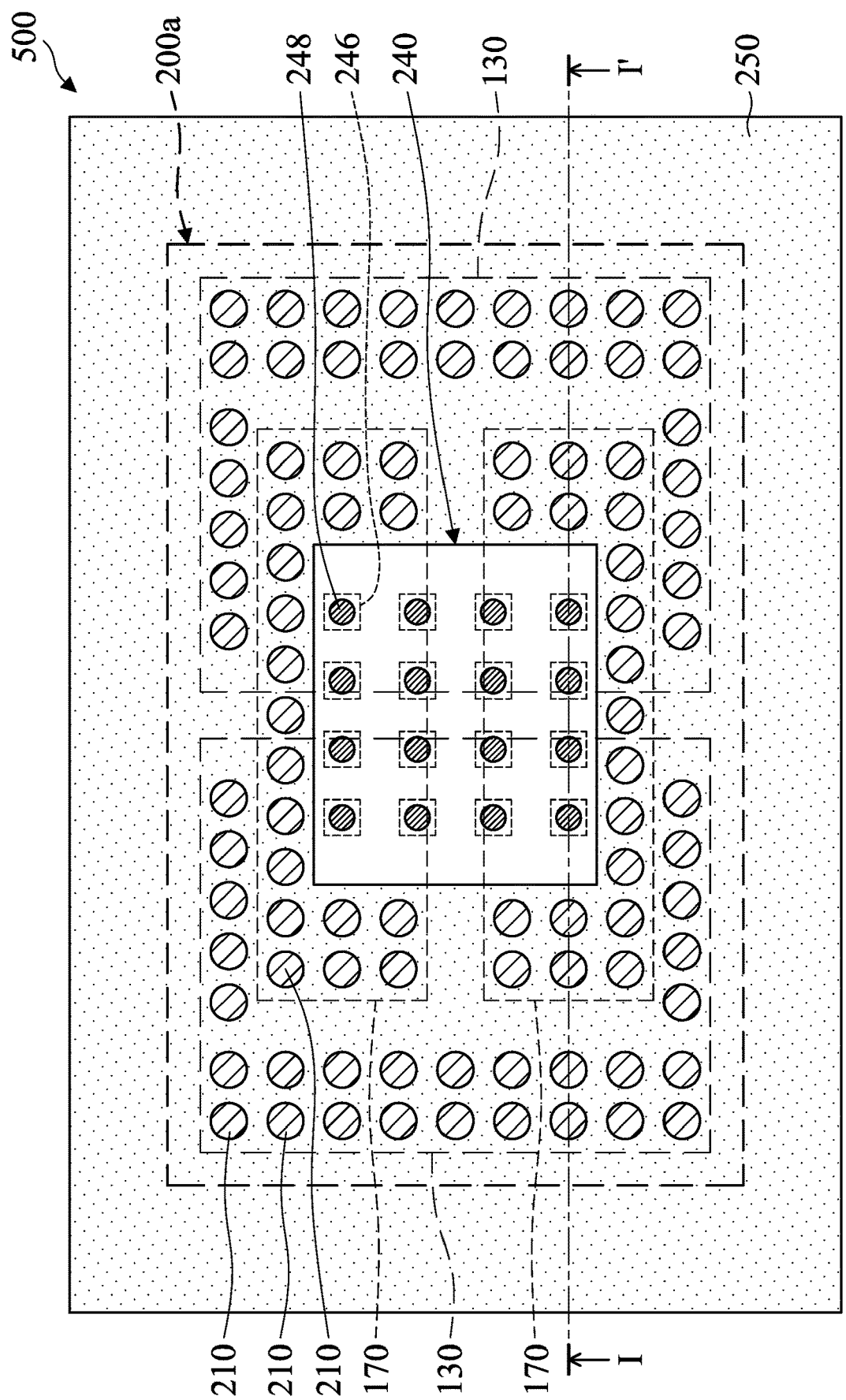

FIGS. 2A-2H are cross-sectional views of various stages of a process for forming a chip package structure, in accordance with some embodiments. FIGS. 2B-1 and 2H-1 are top views of the chip package structure of FIGS. 2B and 2H, in accordance with some embodiments. FIG. 2B is a cross-sectional view illustrating the package 400 along a sectional line I-I' in FIG. 2B-1, in accordance with some embodiments.

FIG. 2H is a cross-sectional view illustrating the chip package structure 500 along a sectional line I-I' in FIG. 2H-1, in accordance with some embodiments. It should be noted that the elements in FIGS. 2A-2H, which are named and labeled identically to those in FIGS. 1A-1H, have the materials similar thereto. Therefore, detailed descriptions are not repeated herein.

As shown in FIG. 2A, a carrier substrate 110 is provided, in accordance with some embodiments. The carrier substrate 110 is configured to provide temporary mechanical and structural support during subsequent processing steps, in accordance with some embodiments. As shown in FIG. 2A, an adhesive layer 120 is formed over the carrier substrate 110, in accordance with some embodiments. The adhesive layer 120 is formed using a lamination process, a spin coating process, or another suitable process.

As shown in FIG. 2A, chip structures 130 are provided over the adhesive layer 120, in accordance with some embodiments. Each of the chip structures 130 includes a chip 132, a dielectric layer 134, bonding pads 136, interconnection structures 138, and a passivation layer 139, in accordance with some embodiments. The dielectric layer 134 is formed over the chip 132, in accordance with some embodiments.

The bonding pads 136 are formed in the dielectric layer 134, in accordance with some embodiments. The bonding pads 136 are electrically connected to devices (not shown) formed in/over the chip 132, in accordance with some embodiments. The interconnection structures 138 are formed over the respective bonding pads 136, in accordance with some embodiments.

The interconnection structures 138 include conductive pillars or conductive bumps, in accordance with some embodiments. The passivation layer 139 is formed over the dielectric layer 134 and surrounds the interconnection structures 138, in accordance with some embodiments.

As shown in FIG. 2A, insulating layers 150 are formed over the chip structures 130, respectively, in accordance with some embodiments. Each of the insulating layers 150 has holes 152 over the interconnection structures 138 of the chip structure 130 thereunder, in accordance with some embodiments. The holes 152 respectively expose the interconnection structures 138 thereunder, in accordance with some embodiments.

As shown in FIG. 2A, conductive pillars 160 are formed in and over the holes 152 to be electrically connected to the interconnection structures 138, respectively, in accordance with some embodiments. The conductive pillars 160 include copper or another suitable conductive material.

As shown in FIGS. 2B and 2B-1, chip structures 170 are provided over the insulating layers 150, in accordance with some embodiments. The chip structures 170 are positioned over the chip structures 130, in accordance with some embodiments. The insulating layers 150 separate the chip structures 130 from the chip structures 170, in accordance with some embodiments.

In some embodiments, a portion of each of the chip structures 130 is exposed by the chip structures 170. The chip structures 170 are between the conductive pillars 160, in accordance with some embodiments. The conductive pillars 160 surround the chip structures 170, in accordance with some embodiments.

Each of the chip structures 170 includes a chip 172, a dielectric layer 174, bonding pads 176, interconnection structures 178, and a passivation layer 179, in accordance with some embodiments. The dielectric layer 174 is formed over the chip 172, in accordance with some embodiments.

The bonding pads 176 are formed in the dielectric layer 174, in accordance with some embodiments. The bonding pads 176 are electrically connected to devices (not shown) formed in/over the chip 172, in accordance with some embodiments. The interconnection structures 178 are formed over the bonding pads 176 respectively, in accordance with some embodiments.

The interconnection structures 178 include conductive pillars or conductive bumps, in accordance with some embodiments. The passivation layer 179 is formed over the dielectric layer 174 and surrounds the interconnection structures 178, in accordance with some embodiments. The passivation layer 179 includes a polymer material or another suitable insulating material.

As shown in FIG. 2C, a molding layer 180 is formed over the adhesive layer 120, in accordance with some embodiments. The molding layer 180 surrounds the chip structures 130 and 170 and the conductive pillars 160, in accordance with some embodiments. The molding layer 180 covers the chip structures 130, in accordance with some embodiments. In some embodiments, portions of the molding layer 180 are between the chip structures 130 and 170 and the conductive pillars 160. The molding layer 180 includes a polymer material or another suitable insulating material.

The molding layer 180 and the carrier substrate 110 are made of different materials, in accordance with some embodiments. For eliminating or reducing the warpage of the package 400, the coefficient of thermal expansion of the material of the carrier substrate 110 is less than the coefficient of thermal expansion of the material of the molding layer 180, in accordance with some embodiments.

The formation of the molding layer 180 includes forming a molding compound material layer over the adhesive layer 120; performing a curing process to cross-link (or thermoset) the polymers of the molding compound material layer; performing a grinding process over the molding compound material layer until the conductive pillars 160 and the interconnection structures 178 are exposed, in accordance with some embodiments.

Therefore, top surfaces 178*a*, 170*a*, 162, and 182 of the interconnection structures 178, the chip structures 170, the conductive pillars 160, and the molding layer 180 are coplanar, in accordance with some embodiments. The conductive pillars 160 pass through the molding layer 180, in accordance with some embodiments.

As shown in FIG. 2D, an insulating layer 190 is formed over the molding layer 180 and the chip structures 170, in accordance with some embodiments. The insulating layer 190 has holes 192 over the conductive pillars 160 and the interconnection structures 178, in accordance with some embodiments.

The holes 192 respectively expose the conductive pillars 160 thereunder and the interconnection structures 178 thereunder, in accordance with some embodiments. As shown in FIG. 2D, conductive pillars 210 are formed in and over the holes 192 to be electrically connected to the conductive pillars 160 and the interconnection structures 178, respectively, in accordance with some embodiments.

As shown in FIG. 2E, the chip structures 130 and the molding layer 180 are debonded from the carrier substrate 110, in accordance with some embodiments. The debonding process includes performing a thermal process over the adhesive layer 120, in accordance with some embodiments. For example, the adhesive layer 120 is irradiated with UV light to weaken the adhesive properties of the adhesive layer 120.

As shown in FIG. 2E, a sawing process is performed over the insulating layer 190 and the molding layer 180 to form individual chip package structures 200*a*, in accordance with some embodiments. Each of the chip package structures 200*a* includes the chip structures 130, the conductive pillars 160, the chip structures 170, the molding layer 180, the insulating layer 190, and the conductive pillars 210, in accordance with some embodiments. In each of the chip package structures 200*a*, side walls 194 and 184 of the insulating layer 190 and the molding layer 180 are coplanar, in accordance with some embodiments.

As shown in FIG. 2F, a carrier substrate 220 is provided, in accordance with some embodiments. The carrier substrate 220 is configured to provide temporary mechanical and structural support during subsequent processing steps, in accordance with some embodiments. As shown in FIG. 2F, an adhesive layer 230 is formed over the carrier substrate 220, in accordance with some embodiments.

As shown in FIG. 2F, the chip package structures 200*a* are disposed over the adhesive layer 230, in accordance with some embodiments. As shown in FIG. 2F, chip structures 240 are provided over the chip package structures 200*a*, respectively, in accordance with some embodiments.

The chip structure 240 is over the chip structures 170 and the molding layer 180 of one of the chip package structures 200*a*, in accordance with some embodiments. The insulating layer 190 separates the chip structures 170 thereunder from the chip structure 240 thereover, in accordance with some embodiments.

Each of the chip structures 240 includes a chip 242, a dielectric layer 244, bonding pads 246, interconnection structures 248, and a passivation layer 249, in accordance with some embodiments. The dielectric layer 244 is formed over the chip 242, in accordance with some embodiments. The bonding pads 246 are formed in the dielectric layer 244, in accordance with some embodiments. The bonding pads 246 are electrically connected to devices (not shown) formed in/over the chip 242, in accordance with some embodiments.

The interconnection structures 248 are formed over the bonding pads 246 respectively, in accordance with some embodiments. The interconnection structures 248 include conductive pillars or conductive bumps, in accordance with some embodiments. The passivation layer 249 is formed over the dielectric layer 244 and surrounds the interconnection structures 248, in accordance with some embodiments.

As shown in FIG. 2G, a molding layer 250 is formed over the adhesive layer 230 and the chip package structures 200a, in accordance with some embodiments. The molding layer 250 surrounds the chip package structures 200a and the chip structures 240, in accordance with some embodiments.

The molding layer 250 includes a polymer material or another suitable insulating material. In some embodiments, the molding layers 180 and 250 are made of different materials. In some other embodiments, the molding layers 180 and 250 are made of the same material.

The molding layer 250 and the carrier substrate 220 are made of different materials, in accordance with some embodiments. For eliminating or reducing the warpage of the package of FIG. 2G, the coefficient of thermal expansion of the material of the carrier substrate 220 is less than the coefficient of thermal expansion of the material of the molding layer 250, in accordance with some embodiments.

As shown in FIG. 2G, a wiring structure 260 is formed over the molding layer 250, the chip structures 240, and the chip package structures 200a, in accordance with some embodiments. The wiring structure 260 includes a dielectric layer 262, wiring layers 264, conductive pads 266, and conductive vias 268, in accordance with some embodiments. The wiring layers 264 and conductive vias 268 are in the dielectric layer 262, in accordance with some embodiments. The conductive pads 266 are over the dielectric layer 262, in accordance with some embodiments.

The conductive vias 268 are between the conductive pads 266, the wiring layers 264, the conductive pillars 210, and the interconnection structures 248, in accordance with some embodiments. Therefore, the conductive pads 266, the wiring layers 264, the conductive pillars 210, and the interconnection structures 248 are able to be electrically connected to each other through the conductive vias 268 according to design requirements, in accordance with some embodiments.

As shown in FIG. 2G, conductive bumps 270 are formed over the conductive pads 266, respectively, in accordance with some embodiments. The conductive bumps 270 include tin (Sn) or another suitable conductive material. The formation of the conductive bumps 270 includes forming a solder paste over the conductive pads 266 and reflowing the solder paste, in accordance with some embodiments.

As shown in FIGS. 2H and 2H-1, the chip package structures 200a and the molding layer 250 are debonded from the carrier substrate 220, in accordance with some embodiments. The debonding process includes performing a thermal process over the adhesive layer 230, in accordance with some embodiments. For example, the adhesive layer 230 is irradiated with UV light to weaken the adhesive properties of the adhesive layer 230.

As shown in FIGS. 2H and 2H-1, a sawing process is performed over the wiring structure 260 and the molding layer 250 to form individual chip package structures 500, in accordance with some embodiments. For the sake of simplicity, the conductive bumps 270 and the wiring structure 260 are omitted in FIG. 2H-1, in accordance with some embodiments.

Each of the chip package structures 500 includes the chip package structure 200a, the chip structure 240, the molding layer 250, the wiring structure 260, and the conductive bumps 270, in accordance with some embodiments. In the chip package structure 500, side walls 262 and 252 of the wiring structure 260 and the molding layer 250 are coplanar, in accordance with some embodiments.

In the chip package structure 500, top surfaces 212, 254, 249a, and 248a of the conductive pillars 210, the molding layer 250, the passivation layer 249, and the interconnection structures 248 are coplanar, in accordance with some embodiments. The conductive pillars 210 pass through the molding layer 250, in accordance with some embodiments. The molding layer 250 continuously surrounds the entire chip package structures 200a and the entire chip structure 240, in accordance with some embodiments. The molding layer 180 is a single layer structure, in accordance with some embodiments.

In some embodiments, a bottom surface 132a of the chip 132, a bottom surface 186 of the molding layer 180, and a bottom surface 256 of the molding layer 250 are coplanar. The molding layer 250 surrounds the insulating layers 190 and 150, in accordance with some embodiments. The molding layer 180 covers side walls 132c and top surfaces 132b of the chips 132 and side walls 172c and bottom surfaces 172b of the chips 172, in accordance with some embodiments.

The molding layer 180 covers top surfaces 132b of the chips 132 but does not cover top surfaces 172a of the chips 172, in accordance with some embodiments. The molding layer 250 does not cover a top surface 242a of the chip 242, in accordance with some embodiments. The molding layer 180 does not cover the bottom surfaces 132a of the chips 132, in accordance with some embodiments. The molding layer 250 does not cover the bottom surfaces 132a and 186 of the chips 132 and the molding layer 180, in accordance with some embodiments. The chip package structure 500 is a fan-out chip package structure, in accordance with some embodiments.

In accordance with some embodiments, chip package structures and methods for forming the same are provided. The methods (for forming the chip package structure) include performing a first sawing process to form individual first chip package structures; disposing the first chip package structures over a carrier substrate; forming a molding layer over the carrier substrate and the first chip package structures; and performing a second sawing process to form individual second chip package structures. The warpage of the second chip package structure is eliminated or reduced by selecting the materials of the molding layer and the carrier substrate. The yield of the second chip package structures is improved.

In accordance with some embodiments, a chip package structure is provided. The chip package structure includes a first chip, a second chip, and a third chip. The second chip is between the first chip and the third chip, the second chip includes a substrate, a bonding pad, an interconnection structure, and a passivation layer, the bonding pad is over the substrate, the passivation layer is over the bonding pad and the substrate, and the interconnection structure is over the bonding pad and embedded in the passivation layer. The chip package structure includes a first molding layer surrounding the first chip and the second chip. The first molding layer is a single layer structure. A first boundary surface between the passivation layer and the second molding layer extends toward the first chip. The chip package structure includes a second molding layer surrounding the third chip and the first molding layer. A first bottom surface of the first molding layer and a second bottom surface of the second molding layer are substantially coplanar.

In accordance with some embodiments, a chip package structure is provided. The chip package structure includes a first chip, a second chip, and a third chip. The second chip is between the first chip and the third chip, the second chip includes a substrate, a bonding pad, an interconnection structure, and a passivation layer, the bonding pad is over the substrate, the passivation layer is over the bonding pad and the substrate, and the interconnection structure is over the bonding pad and embedded in the passivation layer. The chip package structure includes a first molding layer surrounding the first chip and the second chip. The first molding layer is a single layer structure, and a first top surface of the interconnection structure and a second top surface of the first molding layer are substantially coplanar. The chip package structure includes a second molding layer surrounding the third chip and the first molding layer. A first bottom surface of the first molding layer and a second bottom surface of the second molding layer are substantially coplanar.

In accordance with some embodiments, a chip package structure is provided. The chip package structure includes a first chip, a second chip, and a third chip. The second chip is between the first chip and the third chip. The chip package structure includes a first molding layer surrounding the first chip and the second chip. The first molding layer is a single layer structure, and the first molding layer is in direct contact with a first sidewall and a top surface of the first chip and a second sidewall and a bottom surface of the second chip. The chip package structure includes a second molding layer surrounding the third chip and the first molding layer. A first bottom surface of the first molding layer and a second bottom surface of the second molding layer are substantially coplanar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   a first chip, a second chip, and a third chip, wherein the second chip is between the first chip and the third chip, the second chip comprises a substrate, a bonding pad, an interconnection structure, and a passivation layer, the bonding pad is over the substrate, the passivation layer is over the bonding pad and the substrate, and the interconnection structure is over the bonding pad and embedded in the passivation layer;
   a first molding layer surrounding the first chip and the second chip, wherein the first molding layer is a single layer structure, wherein a first boundary surface between the passivation layer and the first molding layer extends toward the first chip;
   a second molding layer surrounding the third chip and the first molding layer, wherein a first bottom surface of the first molding layer and a second bottom surface of the second molding layer are coplanar;
   a fourth chip adjacent to the first chip, wherein the second chip is between the third chip and the fourth chip, a first portion of the first molding layer is between the first chip and the fourth chip, and both the second chip and the third chip extend across the first portion of the first molding layer,
   the first chip has a first sidewall, a second sidewall, and a third sidewall, the second sidewall faces the fourth chip and is between the first sidewall and the third sidewall, the first sidewall is opposite to the third sidewall, the second chip is between the first sidewall and the third sidewall, and the first sidewall is closer to the second chip than the third sidewall in a top view of the first chip, the second chip, and the fourth chip; and
   a fifth chip over the first chip and the fourth chip and under the third chip, wherein the fifth chip is between the second chip and the third sidewall of the first chip in a top view of the first chip, the second chip, the third chip, the fourth chip, and the fifth chip.

2. The chip package structure as claimed in claim 1, wherein a third bottom surface of the first chip, the first bottom surface of the first molding layer, and the second bottom surface of the second molding layer are coplanar.

3. The chip package structure as claimed in claim 1, further comprising:
   a conductive pillar over the first chip and passing through the first molding layer.

4. The chip package structure as claimed in claim 3, wherein a first top surface of the first molding layer and a second top surface of the conductive pillar are coplanar.

5. The chip package structure as claimed in claim 4, wherein a third top surface of the passivation layer, the first top surface and the second top surface are coplanar.

6. The chip package structure as claimed in claim 1, wherein the first molding layer and the second molding layer are made of different materials.

7. The chip package structure as claimed in claim 1, wherein the first molding layer covers a side wall and a top surface of the first chip and a side wall and a bottom surface of the second chip.

8. The chip package structure as claimed in claim 1, further comprising:
   a conductive pillar over the second chip and the first portion of the first molding layer.

9. The chip package structure as claimed in claim 1, further comprising:
   an insulating layer over the first molding layer and the second chip; and
   a first conductive pillar passing through the insulating layer and the second molding layer.

10. The chip package structure as claimed in claim 9, further comprising:
    a second conductive pillar over the fourth chip and passing through the first molding layer, wherein the second conductive pillar is under and in direct contact with the first conductive pillar.

11. The chip package structure as claimed in claim 10, wherein a second portion of the insulating layer is between the second chip and the third chip.

12. The chip package structure as claimed in claim 5, wherein the fifth chip is between the second chip and the conductive pillar.

13. A chip package structure, comprising:
- a first chip, a second chip, and a third chip, wherein the second chip is between the first chip and the third chip, the second chip comprises a substrate, a bonding pad, an interconnection structure, and a passivation layer, the bonding pad is over the substrate, the passivation layer is over the bonding pad and the substrate, and the interconnection structure is over the bonding pad and embedded in the passivation layer;
- a first molding layer surrounding the first chip and the second chip, wherein the first molding layer is a single layer structure, and a first top surface of the interconnection structure and a second top surface of the first molding layer are coplanar;
- a second molding layer surrounding the third chip and the first molding layer, wherein a first bottom surface of the first molding layer and a second bottom surface of the second molding layer are coplanar;
- a fourth chip adjacent to the first chip, wherein the second chip is between the third chip and the fourth chip, a portion of the first molding layer is between the first chip and the fourth chip, the second chip extends across the portion of the first molding layer and is in direct contact with the first chip and the fourth chip, a first bottom surface of the first chip, a second bottom surface of the fourth chip, a third bottom surface of the first molding layer, a fourth bottom surface of the second molding layer are level with each other,
- the first chip has a first sidewall, a second sidewall, and a third sidewall, the second sidewall faces the fourth chip and is between the first sidewall and the third sidewall, the first sidewall is opposite to the third sidewall, the second chip is between the first sidewall and the third sidewall, the first sidewall is closer to the second chip than the third sidewall in a top view of the first chip, the second chip, the third chip, and the fourth chip,
- the second chip has a fourth sidewall and a fifth sidewall, the fourth sidewall is opposite to the fifth sidewall and between the first sidewall and the fifth sidewall, and a sixth sidewall of the third chip overlaps the fifth sidewall and spaced apart from the first sidewall and the fourth sidewall in the top view; and
- a first conductive pillar over the first chip and between the first sidewall and the second chip in a top view of the first conductive pillar, the first chip, the second chip, the third chip, and the fourth chip.

14. The chip package structure as claimed in claim 13, further comprising:
- a second conductive pillar over the interconnection structure and passing through the second molding layer, wherein the interconnection structure is between the second conductive pillar and the bonding pad, and the second conductive pillar is between the first sidewall and the third chip.

15. The chip package structure as claimed in claim 13, wherein the third chip has a first corner portion and a second corner portion, the sixth sidewall of the third chip is between the first corner portion and the second corner portion, the first corner portion overlaps the first chip and the second chip, and the second corner portion overlaps the first chip and the fifth chip.

16. A chip package structure, comprising:
- a first chip, a second chip, and a third chip, wherein the second chip is between the first chip and the third chip;
- a first molding layer surrounding the first chip and the second chip, wherein the first molding layer is a single layer structure, and the first molding layer is in direct contact with a first sidewall and a top surface of the first chip and a second sidewall and a bottom surface of the second chip;
- a second molding layer surrounding the third chip and the first molding layer, wherein a first bottom surface of the first molding layer and a second bottom surface of the second molding layer are coplanar;
- a fourth chip adjacent to the first chip, wherein a portion of the first molding layer is between the first chip and the fourth chip,
- the first chip has a third sidewall, a fourth sidewall, and a fifth sidewall, the fourth sidewall faces the fourth chip and is between the third sidewall and the fifth sidewall, the third sidewall is opposite to the fifth sidewall, the second chip is between the third sidewall and the fifth sidewall, and a first distance between the third sidewall and the second chip is less than a second distance between the second chip and the fifth sidewall in a top view of the first chip, the second chip, and the fourth chip; and
- a fifth chip over the first chip and the fourth chip and under the third chip, wherein the fifth chip is between the second chip and the fifth sidewall of the first chip in a top view of the first chip, the second chip, the third chip, the fourth chip, and the fifth chip.

17. The chip package structure as claimed in claim 16, wherein the first bottom surface, the second bottom surface, a third bottom surface of the first chip are coplanar.

18. The chip package structure as claimed in claim 17, wherein the first bottom surface, the second bottom surface, the third bottom surface, and a fourth bottom surface of the fourth chip are coplanar.

19. The chip package structure as claimed in claim 16, further comprising:
- an insulating layer over the first molding layer and the second chip; and
- a conductive pillar over the second chip and passing through the second molding layer and the insulating layer.

20. The chip package structure as claimed in claim 16, further comprising:
- a first conductive pillar over the first chip and passing through the first molding layer; and
- a second conductive pillar over the fourth chip and passing through the first molding layer, wherein the fifth chip is between the first conductive pillar and the second conductive pillar.

* * * * *